(12) United States Patent
Yamane

(10) Patent No.: US 10,680,570 B2
(45) Date of Patent: Jun. 9, 2020

(54) MAGNETORESISTANCE EFFECT DEVICE AND HIGH FREQUENCY DEVICE

(71) Applicant: TDK CORPORATION, Tokyo (JP)

(72) Inventor: Takekazu Yamane, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/123,675

(22) Filed: Sep. 6, 2018

(65) Prior Publication Data

US 2019/0081606 A1 Mar. 14, 2019

(30) Foreign Application Priority Data

Sep. 8, 2017 (JP) .................................. 2017-172713
Aug. 10, 2018 (JP) .................................. 2018-151676

(51) Int. Cl.

| H01L 43/02 | (2006.01) |
| H03H 2/00 | (2006.01) |
| H01L 43/10 | (2006.01) |
| H03B 15/00 | (2006.01) |
| H01L 43/08 | (2006.01) |

(52) U.S. Cl.
CPC ............... *H03H 2/00* (2013.01); *H01L 43/02* (2013.01); *H01L 43/08* (2013.01); *H01L 43/10* (2013.01); *H03B 15/006* (2013.01)

(58) Field of Classification Search
CPC ........... H03H 7/06; H01L 43/02; H01L 43/08; H01L 43/10
USPC .............................. 327/510; 365/158; 360/31
See application file for complete search history.

(56) References Cited

U.S. PATENT DOCUMENTS

| 9,948,267 B2 | 4/2018 | Yamane et al. |
| 2012/0025926 A1* | 2/2012 | Kakinuma ............... H03D 7/00 333/100 |

FOREIGN PATENT DOCUMENTS

WO 2007/032149 A1 3/2007

OTHER PUBLICATIONS

Beaujour et al; "Ferromagnetic resonance study of polycrystalline cobalt ultrathin films;" Journal of Applied Physics; vol. 99; Apr. 17, 2006.
Schumacher et al; "Precessional switching of the magnetization in microscopic magnetic tunnel junctions (invited);" Journal of Applied Physics; vol. 93; No. 10; May 15, 2003.

(Continued)

*Primary Examiner* — Tomi Skibinski
(74) *Attorney, Agent, or Firm* — Oliff PLC

(57) ABSTRACT

Provided is a magnetoresistance effect device that functions as a high frequency device such as a high frequency filter or the like. The magnetoresistance effect device includes a magnetoresistance effect element having a first ferromagnetic layer, a second ferromagnetic layer, and a spacer layer sandwiched between the first ferromagnetic layer and the second ferromagnetic layer, a first signal line configured to generate a high frequency magnetic field as a high frequency current flows, a direct current application terminal to which a power supply is able to be connected to cause a direct current to flow to the magnetoresistance effect element in a lamination direction, and an independent magnetic body configured to receive a high frequency magnetic field generated in the first signal line to oscillate magnetization and apply a magnetic field generated through the magnetization to the magnetoresistance effect element.

20 Claims, 13 Drawing Sheets

(56) References Cited

OTHER PUBLICATIONS

Bilzer et al; "Vector network analyzer ferromagnetic resonance of thin films on coplanar waveguides: Comparison of different evaluation methods;" Journal of Applied Physics; vol. 101; Apr. 12, 2007.
Kalarickal et al; "Ferromagnetic resonance linewidth in metallic thin films: Comparison of measurement methods;" Journal of Applied Physics; vol. 99; May 15, 2006.
K. Konishi, et al., "Radio-Frequency Amplification Property of the MgO-based Magnetic Tunnel Junction Using Field-Induced Ferrogagnetic Resonance," Appl. Phys. Lett. 102, 162409 (Apr. 25, 2013).

\* cited by examiner

MAGNETORESISTANCE EFFECT DEVICE AND HIGH FREQUENCY DEVICE

BACKGROUND OF THE INVENTION

Field of the Invention

The present disclosure relates to a magnetoresistance effect device and a high frequency device.

Priority is claimed on Japanese Patent Application No. 2017-172713, filed on Sep. 8, 2017, and Japanese Patent Application No. 2018-151676, filed Aug. 10, 2018, the content of which are incorporated herein by reference.

Description of Related Art

In recent years, according to the enhanced functionality of mobile communication terminals such as cellular phones or the like, an increase in speed of wireless communication has progressed. Since the communication speed is proportional to a bandwidth of a frequency used, a frequency band required for communication has increased. Accordingly, the number of mounted high frequency filters required for a mobile communication terminal has increased.

In addition, spintronics has recently been researched as a technology that may be able to be applied to new high frequency components. One of phenomena attracting attention regarding this is a ferromagnetic resonance phenomenon of a magnetoresistance effect element (see Non-Patent Document 1).

When an alternating magnetic field is applied to a magnetoresistance effect element, a ferromagnetic resonance can occur in the magnetoresistance effect element. When the ferromagnetic resonance occurs, a resistance value of the magnetoresistance effect element periodically oscillates at a frequency corresponding to a ferromagnetic resonance frequency (hereinafter, referred to as a resonance frequency). The resonance frequency of the magnetoresistance effect element varies according to an intensity of a magnetic field applied to the magnetoresistance effect element, and in general, the resonance frequency is a high frequency band of several to several tens of GHz.

CITATION LIST

Patent Documents

Non-Patent Document 1

J. M. L. Beaujour et al., JOURNAL OF APPLIED PHYSICS 99, 08N503 (2006).

SUMMARY OF THE INVENTION

As described above, research on high frequency oscillation elements using a ferromagnetic resonance phenomenon is proceeding. However, there is still insufficient specific research on the ferromagnetic resonance phenomenon and other applications.

In consideration of the above-mentioned problems, the present disclosure is directed to providing a magnetoresistance effect device which functions as a high frequency device such as a high frequency filter or the like using a ferromagnetic resonance phenomenon.

In order to solve the problems, a method of using a magnetoresistance effect device that uses a ferromagnetic resonance phenomenon as a high frequency device was examined. The result was that a magnetoresistance effect device utilizing a resistance value of a magnetoresistance effect element temporally varying due to a ferromagnetic resonance phenomenon was found, and it was found that the magnetoresistance effect device functions as a high frequency device.

In addition, it was found that, when an independent magnetic body is installed, noise due to thermal fluctuation or the like can be reduced, and a magnetoresistance effect device having good output characteristics can be obtained.

That is, the present disclosure provides the following means in order to solve the above problems.

(1) A magnetoresistance effect device according to a first aspect includes a magnetoresistance effect element having a first ferromagnetic layer, a second ferromagnetic layer, and a spacer layer sandwiched between the first ferromagnetic layer and the second ferromagnetic layer; a first signal line configured to generate a high frequency magnetic field when a high frequency current flows; a direct current application terminal to which a power supply is able to be connected to cause a direct current to flow to the magnetoresistance effect element in a lamination direction; and an independent magnetic body configured to receive a high frequency magnetic field generated in the first signal line to oscillate magnetization and apply a magnetic field generated through the magnetization to the magnetoresistance effect element.

(2) In the magnetoresistance effect device according to the aspect, a resonance frequency of the independent magnetic body may be smaller than a resonance frequency of the first ferromagnetic layer and the second ferromagnetic layer.

(3) The magnetoresistance effect device according to the aspect may further include a low pass filter configured to reduce a part of a signal output to the outside, wherein the low pass filter may allow a frequency smaller than the resonance frequency of the first ferromagnetic layer and the second ferromagnetic layer to pass therethrough.

(4) In the magnetoresistance effect device according to the aspect, a volume of the independent magnetic body may be 100 times or more a volume of the first ferromagnetic layer or the second ferromagnetic layer.

(5) In the magnetoresistance effect device according to the aspect, a damping constant of the independent magnetic body may be 0.005 or less.

(6) In the magnetoresistance effect device according to the aspect, the independent magnetic body may be an insulating material.

(7) In the magnetoresistance effect device according to the aspect, the independent magnetic body may be an electrical conductor.

(8) The magnetoresistance effect device according to the aspect may further include a magnetic field application mechanism configured to apply an external magnetic field to the independent magnetic body, and modulate a resonance frequency of at least one of the independent magnetic body, the first ferromagnetic layer and the second ferromagnetic layer.

(9) The magnetoresistance effect device according to the aspect may further include a bias magnetic layer configured to apply an external magnetic field to the first ferromagnetic layer or the second ferromagnetic layer of the magnetoresistance effect element, and modulate a resonance frequency of the first ferromagnetic layer or the second ferromagnetic layer.

(10) The magnetoresistance effect device according to the aspect may have a plurality of magnetoresistance effect elements, and a plurality of magnetoresistance effect elements may be disposed with respect to the one independent magnetic body.

(11) The magnetoresistance effect device according to the aspect may have a plurality of magnetoresistance effect elements and a plurality of independent magnetic bodies, and each independent magnetic body may be disposed with respect to one magnetoresistance effect element, respectively.

(12) In the magnetoresistance effect device according to the aspect, at least some of the plurality of magnetoresistance effect elements may be arranged parallel to each other.

(13) In the magnetoresistance effect device according to the aspect, at least some of the plurality of magnetoresistance effect element may be arranged in series.

(14) In the magnetoresistance effect device according to the aspect, each of the plurality of magnetoresistance effect elements may have an output signal line through which a high frequency current output from the magnetoresistance effect element flows, and at least one of the output signal lines may be disposed at a position where a high frequency magnetic field is applied to the independent magnetic body configured to apply a magnetic field to at least one of the plurality of magnetoresistance effect elements.

(15) A high frequency device according to a second aspect uses the magnetoresistance effect device according to the aspect.

According to the magnetoresistance effect device of the aspect, the magnetoresistance effect device using a ferromagnetic resonance phenomenon may be used as a high frequency device such as a high frequency filter, an amplifier, or the like.

In addition, according to the magnetoresistance effect device according to the aspect, a resistance value variation of the magnetoresistance effect element is greatly affected by oscillation of magnetization of the independent magnetic body having a large magnetic moment. For this reason, occurrence of noise generated due to oscillation of the magnetization of the first ferromagnetic layer and the second ferromagnetic layer due to thermal fluctuation can be decreased.

DETAILED DESCRIPTION OF THE INVENTION

Hereinafter, a magnetoresistance effect device will be described in detail with reference to the accompanying drawings. The drawings used in the following description may be shown by enlarging feature parts for the sake of convenience to make the feature parts easier to understand, and dimensional proportions of components may be different from actual ones. Materials, dimensions, or the like, exemplarily shown in the following description are examples, and the present disclosure is not limited thereto and may be appropriately modified and embodied without departing from the spirit of the present disclosure.

First Embodiment

Figure 1:
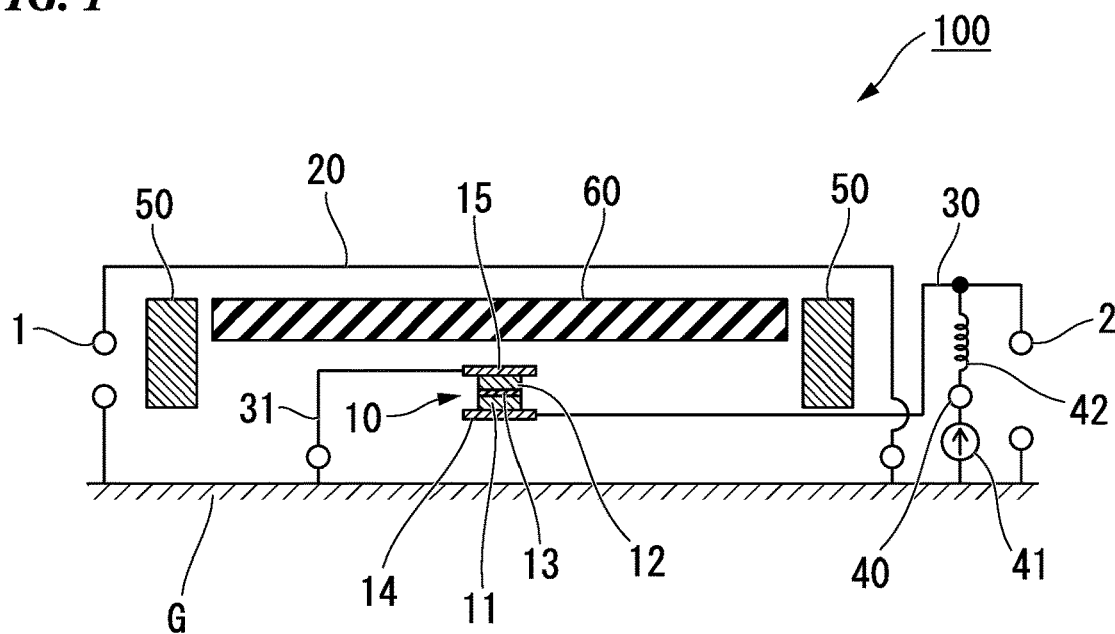
FIG. 1 is a schematic view showing a magnetoresistance effect device according to a first embodiment.

FIG. 1 is a schematic view showing a circuit configuration of a magnetoresistance effect device according to a first embodiment. A magnetoresistance effect device 100 shown in FIG. 1 has a magnetoresistance effect element 10, a first signal line 20, a direct current application terminal 40 and an independent magnetic body 60. The magnetoresistance effect device 100 inputs a signal from a first port 1 and outputs a signal from a second port 2. The output signal can be modulated by a magnetic field application mechanism 50.

<First Port and Second Port>

The first port 1 is an input terminal of the magnetoresistance effect device 100. The first port 1 corresponds to one end of the first signal line 20. An alternating current signal can be applied to the magnetoresistance effect device 100 by connecting an alternating current signal source (not shown) to the first port 1.

The second port 2 is an output terminal of the magnetoresistance effect device 100. The second port 2 corresponds to one end of an output signal line (a second signal line) 30 that transmits a signal output from the magnetoresistance effect element 10. A signal output from the magnetoresistance effect device 100 can be measured by connecting a high frequency measuring instrument (not shown) to the second port 2. For example, a network analyzer or the like can be used in the high frequency measuring instrument.

<Magnetoresistance Effect Element>

The magnetoresistance effect element 10 has a first ferromagnetic layer 11, a second ferromagnetic layer 12 and a spacer layer 13. The spacer layer 13 is disposed between the first ferromagnetic layer 11 and the second ferromagnetic layer 12. Hereinafter, a direction of magnetization of the first ferromagnetic layer 11 and a direction of magnetization of the second ferromagnetic layer 12 relatively vary to function as the magnetoresistance effect element 10. The first ferromagnetic layer 11 and the second ferromagnetic layer 12 may have a configuration in which a magnetization, with respect to a magnetization of one fixed side, of the other side varies (a configuration in which one side is the magnetization fixed layer and the other side is the magnetization free layer), or may have a configuration in which directions of magnetization of both sides respectively vary (a configuration in which both sides are referred to as magnetization free layers) in a predetermined magnetic field environment. In either of these cases, since the two directions of the magnetization are relatively varied, a resistance value variation occurs. Hereinafter, a case in which the first ferromagnetic layer 11 is the magnetization fixed layer and the second ferromagnetic layer 12 is the magnetization free layer will be exemplarily described.

The magnetization fixed layer 11 is formed of a ferromagnetic material. The magnetization fixed layer 11 is preferably formed of a high spin polarization material such as Fe, Co, Ni, an alloy of Ni and Fe, an alloy of Fe and Co, an alloy of Fe, Co and B, or the like. When these materials are used, a rate of change of magnetoresistance of the magnetoresistance effect element 10 is increased. In addition, the magnetization fixed layer 11 may be formed of a Heusler alloy. A film thickness of the magnetization fixed layer 11 is preferably 1 to 10 nm.

A magnetization fixing method of the magnetization fixed layer 11 is not particularly limited. For example, an antiferromagnetic layer may be added to come in contact with the magnetization fixed layer 11 in order to fix the magnetization of the magnetization fixed layer 11. In addition, the magnetization of the magnetization fixed layer 11 may be fixed using magnetic anisotropy due to a crystal structure, a shape, or the like. FeO, CoO, NiO, $CuFeS_2$, IrMn, FeMn, PtMn, Cr, Mn, or the like, may be used in the antiferromagnetic layer.

The magnetization free layer 12 is formed of a ferromagnetic material having a magnetization direction that can be varied by an applied magnetic field or spin-polarized electrons from the outside.

The magnetization free layer 12 can use CoFe, CoFeB, CoFeSi, CoMnGe, CoMnSi, CoMnAl, or the like, as a material when an easy axis of magnetization is provided in an in-plane direction perpendicular to a lamination direction in which the magnetization free layer 12 is laminated, or can use Co, a CoCr-based alloy, a Co multilayer film, a CoCrPt-based alloy, a FePt-based alloy, a SmCo-based alloy containing rare earth elements, a TbFeCo alloy, or the like, as a material when an easy axis of magnetization is provided in the lamination direction of the magnetization free layer 12. In addition, the magnetization free layer 12 may be formed of a Heusler alloy.

A thickness of the magnetization free layer 12 is preferably about 1 to 10 nm. In addition, a high spin polarization material may be inserted between the magnetization free layer 12 and the spacer layer 13. When a high spin polarization material is inserted, a high rate of change of magnetoresistance can be obtained.

A CoFe alloy, a CoFeB alloy, or the like, may be exemplified as the high spin polarization material. A film thickness of either a CoFe alloy or a CoFeB alloy is preferably about 0.2 to 1.0 nm.

The spacer layer 13 is a non-magnetic layer disposed between the magnetization fixed layer 11 and the magnetization free layer 12. The spacer layer 13 is constituted by a layer formed of an electric conductor, an insulating material or a semiconductor, or a layer including an electrical conduction point formed of a conductor in an insulating material.

For example, the magnetoresistance effect element 10 may be a tunneling magnetoresistance (TMR) element when the spacer layer 13 is formed of an insulating material, and the magnetoresistance effect element 10 may be a giant magnetoresistance (GMR) element when the spacer layer 13 is formed of a metal.

When the spacer layer 13 is formed of a non-magnetic conductive material, a conductive material such as Cu, Ag, Au, Ru, or the like, can be used. In order to efficiently use a GMR effect, a film thickness of the spacer layer 13 is preferably about 0.5 to 3.0 nm.

When a non-magnetic insulating material is applied for the spacer layer 13, $Al_2O_3$, MgO, or the like, is exemplified as a material therefor, and a tunneling magnetoresistance (TMR) effect appears in the magnetoresistance effect element 10. A high rate of change of magnetoresistance is obtained by adjusting a film thickness of the spacer layer 13 such that a coherent tunnel effect appears between the magnetization fixed layer 11 and the magnetization free layer 12. When the TMR effect is used, a film thickness of the spacer layer 13 is preferably about 0.5 to 3.0 nm.

When the spacer layer 13 is formed of a non-magnetic semiconductor material, a material such as ZnO, $In_2O_3$, $SnO_2$, ITO, $GaO_x$, $Ga_2O_x$, or the like, may be used. In this case, a film thickness of the spacer layer 13 is preferably about 1.0 to 4.0 nm.

When a layer including an electrical conduction point constituted by a conductor in a non-magnetic insulating material is applied as the spacer layer 13, a structure including an electrical conduction point constituted by a conductor such as CoFe, CoFeB, CoFeSi, CoMnGe, CoMnSi, CoMnAl, Fe, Co, Au, Cu, Al, Mg, or the like, in a non-magnetic insulating material formed of $Al_2O_3$ or MgO is preferably provided. In this case, a film thickness of the spacer layer 13 is preferably about 0.5 to 2.0 nm.

In order to increase conductivity with respect to the magnetoresistance effect element 10, electrodes are preferably installed on both surfaces of the magnetoresistance effect element 10 in the lamination direction. Hereinafter, an electrode installed on a section below the magnetoresistance effect element 10 in the lamination direction is referred to as a lower electrode 14, and an electrode installed on a section thereabove is referred to as an upper electrode 15. When the lower electrode 14 and the upper electrode 15 are installed, contact of the magnetoresistance effect element 10 with the output signal line 30 and a third signal line 31 is on a plane, and a flow of a signal (current) is in a lamination direction at any position in the in-plane direction of the magnetoresistance effect element 10.

The lower electrode 14 and the upper electrode 15 are formed of a material having conductivity. For example, Ta, Cu, Au, AuCu, Ru, or the like, may be used in the lower electrode 14 and the upper electrode 15.

In addition, a cap layer, a seed layer or a buffer layer may be disposed between the magnetoresistance effect element 10 and the lower electrode 14 or the upper electrode 15. Ru, Ta, Cu, Cr, a lamination film thereof, or the like, is exemplified as the cap layer, the seed layer or the buffer layer. A film thickness of each of the layers is preferably about 2 to 10 nm.

The magnetoresistance effect element 10 has a long side that is preferably 300 nm or less with regard to size when a shape of the magnetoresistance effect element 10 when seen in a plan view is a rectangular shape (including a square shape). When the shape of the magnetoresistance effect element 10 when seen in the plan view is not a rectangular shape, a long side of a rectangular shape that circumscribes the shape of the magnetoresistance effect element 10 when seen in the plan view with a minimum area is defined as a long side of the magnetoresistance effect element 10.

When the long side is as small as about 300 nm, a volume of the magnetization free layer 12 is reduced, and a high-efficiency ferromagnetic resonance phenomenon can be realized. Here, "the shape when seen in a plan view" is a shape of each layer that constitutes the magnetoresistance effect element 10 seen from the lamination direction.

<First Signal Line>

The first signal line 20 in FIG. 1 has one end that is connected to the first port 1, and the other end that is connected to a reference potential. In FIG. 1, the other end is connected to the ground G as the reference potential. A high frequency current flows through the first signal line 20 according to a potential difference between a high frequency signal input to the first port 1 and the ground G When a high frequency current flows through the first signal line 20, a high frequency magnetic field is generated from the first signal line 20. The high frequency magnetic field is applied to the independent magnetic body 60 and the magnetoresistance effect element 10.

The first signal line 20 is not limited to one signal line and may be a plurality of signal lines. In this case, the plurality of signal line is preferably disposed at positions where high frequency magnetic fields generated from the signal lines are strengthened at a position of the independent magnetic body 60.

In addition, the reference potential to which the first signal line 20 is connected is not particularly limited to the ground G. For example, a configuration in which the first signal line 20 is connected to the magnetization fixed layer 11 of the magnetoresistance effect element 10 and a part of the first signal line 20 functions as the lower electrode 14 may be provided. In addition, a configuration in which the first signal line 20 is connected to the magnetization free layer 12 and the first signal line 20 functions as a part of the upper electrode 15 may be provided.

<Output Signal Line, Third Signal Line>

The output signal line 30 propagates a signal output from the magnetoresistance effect element 10. The signal output from the magnetoresistance effect element 10 is a signal having a frequency selected using a ferromagnetic resonance of the magnetoresistance effect element 10. The output signal line 30 in FIG. 1 has one end that is connected to the magnetoresistance effect element 10, and the other end that is connected to the second port 2. That is, the output signal line 30 in FIG. 1 connects the magnetoresistance effect element 10 and the second port 2.

The third signal line 31 has one end that is connected to the magnetoresistance effect element 10, and the other end that is connected to a reference potential. While the third signal line 31 is connected to the ground G that is shared with the reference potential of the first signal line 20 in FIG. 1, the third signal line 31 may be connected to another reference potential. In order to simplify a circuit configuration, the reference potential of the third signal line 31 is preferably shared with the reference potential of the first signal line 20.

A form of each of the signal lines and the ground G is preferably defined as a micro strip line (MSL) type or a coplanar waveguide (CPW) type. When the signal lines and the ground G are designed as a micro strip line (MSL) type or a coplanar waveguide (CPW) type, a signal line width or a ground distance is preferably designed such that a characteristic impedance of the signal line and an impedance of a circuit system are equal to each other. A transmission loss of the signal line can be minimized when the signal lines and the ground G are designed in this way.

<Direct Current Application Terminal>

The direct current application terminal 40 is connected to a power supply 41, and applies a direct current or a direct current voltage to the magnetoresistance effect element 10 in the lamination direction. The power supply 41 may be constituted by a circuit obtained by combining a fixed resistor and a direct current voltage source, which can generate a constant direct current. In addition, the power supply 41 may be a direct current source or may be a direct current voltage source.

An inductor 42 is disposed between the direct current application terminal 40 and the output signal line 30. The inductor 42 allows only a direct current component of the current to pass therethrough while blocking high frequency components of the current. An output signal output from the magnetoresistance effect element 10 by the inductor 42 efficiently flows to the second port 2. In addition, a direct current of the inductor 42 flows to a closed circuit constituted by the power supply 41, the output signal line 30, the magnetoresistance effect element 10, the third signal line 31 and the ground G.

A chip inductor, an inductor constituted by a pattern line, a resistive element having an inductor component, or the like, may be used in the inductor 42. An inductance of the inductor 42 is preferably 10 nH or more.

<Independent Magnetic Body>

The independent magnetic body 60 is a magnetic body that is present independently from other circuit components. The magnetization of the independent magnetic body 60 is oscillated (precesses) by receiving a high frequency magnetic field generated in the first signal line 20. The magnetization of the independent magnetic body 60 generates a magnetic field and exerts an influence on the magnetization of the magnetization free layer 12 of the magnetoresistance effect element 10. The independent magnetic body 60 has a role of transmitting a signal from the first signal line 20 to the magnetoresistance effect element 10, and can amplify the signal from the first signal line 20.

The independent magnetic body 60 is formed of a magnetic material. The independent magnetic body 60 is preferably a magnetic body including an insulating material. For example, ceramics such as ferrite or the like may be used. When the independent magnetic body 60 has an insulating property, a short circuit to the first signal line 20 or the magnetoresistance effect element 10 can be prevented. Further, even when the independent magnetic body 60 is a metal or an alloy having conductivity, a short circuit can be prevented by forming an insulating layer between the members.

When the independent magnetic body 60 has conductivity, the independent magnetic body 60 may be a magnetic body having a soft magnetic body. For example, a magnetic material having a relatively large saturation magnetization Ms and a relatively small coercive force such as Fe, Co, Ni, an alloy of Ni and Fe, an alloy of Fe and Co, or the like, may be used. Since the magnetization of the independent magnetic body 60 is greatly oscillated by receiving the high frequency magnetic field generated in the first signal line 20. In addition, the saturation magnetization Ms is large. A large magnetic field corresponding to the signal flowing through the first signal line 20 can be provided to the magnetization of the magnetization free layer 12 of the magnetoresistance effect element 10.

In addition, when the independent magnetic body 60 has conductivity, the independent magnetic body 60 may be a magnetic body having a hard magnetic body. For example, a magnetic material having a large saturation magnetization Ms and a large coercive force, such as a CoPt alloy, a FePt alloy, a CoCrPt alloy, or the like, may be used. While oscillation of the magnetization of the independent magnetic body 60 is small because the coercive force is large even when the high frequency magnetic field generated in the first signal line 20 is received, since the saturation magnetization Ms can be increased, a large magnetic field corresponding to the signal flowing through the first signal line 20 can be provided to the magnetization of the magnetization free layer 12 of the magnetoresistance effect element 10 as a whole.

In addition, a damping constant of the independent magnetic body 60 is preferably 0.005 or less. The damping constant (herein, a Gilbert damping coefficient) is referred to as a physical constant showing a strength of damping of precession of magnetization of the magnetic body. When the damping constant is small, the magnetization of the independent magnetic body 60 is easily affected by the high frequency magnetic field, and oscillation of the magnetization can be increased.

The independent magnetic body 60 initially receives a signal from the first signal line 20, propagates the signal to the magnetoresistance effect element 10, and amplifies the signal. When the damping constant of the independent magnetic body 60 is small, the magnetization of the independent magnetic body 60 readily precesses due to the high frequency magnetic field generated in the first signal line 20. As a result, the independent magnetic body 60 can apply a large magnetic field to the magnetization free layer 12 of the magnetoresistance effect element 10.

Rare earth element iron garnets (RIG) are known as materials having an insulating property and a small damping constant. Yttrium iron garnet (YIG) among RIG is preferable. YIG has highly magnetic characteristics even in a thin film and a small magnetic loss even in a high frequency band.

A volume of the independent magnetic body 60 is preferably 100 times or more a volume of the magnetization free layer 12, or preferably 1000 times or more the volume of the magnetization free layer 12. A magnetic moment of the magnetic body is determined by a product of the saturation magnetization Ms and the volume of the magnetic body. For this reason, when the volume of the magnetic body is increased, a magnetic moment of the magnetic body is increased, and an output signal is increased.

The output signal is a resistance value variation of the magnetoresistance effect element 10. For this reason, the principle of increasing the volume of the magnetization free layer 12 of the magnetoresistance effect element 10 is usual. However, the magnetization free layer 12 is a component of the magnetoresistance effect element 10, and it is difficult to increase the volume.

On the other hand, since the independent magnetic body 60 is present independently from other circuit components, the volume can be freely set. In addition, the magnetization of the magnetization free layer 12 precesses due to the influence of the precession of the magnetization of the independent magnetic body 60. That is, when a volume of the independent magnetic body 60 is increased, the independent magnetic body 60 can produce a large magnetic field, and the magnetization of the magnetization free layer 12 can be greatly changed.

The independent magnetic body 60 is disposed at a position where the high frequency magnetic field from the first signal line 20 can be received and the magnetization of the magnetization free layer 12 is affected by the magnetic field. For this reason, the independent magnetic body 60 may be disposed at any position above or below the magnetoresistance effect element 10 in the lamination direction (an upward/downward direction in FIG. 1) and an in-plane direction (a leftward/rightward direction in FIG. 1) crossing the lamination direction. In order to efficiently apply the magnetic field in which the magnetization of the independent magnetic body 60 is generated to the magnetization free layer 12, the independent magnetic body 60 is preferably disposed between the first signal line 20 and the magnetoresistance effect element 10. In addition, from a viewpoint of easy manufacture of the magnetoresistance effect device 100, the independent magnetic body 60 is preferably installed above the first signal line 20 (a side opposite to the magnetoresistance effect element 10).

<Magnetic Field Application Mechanism>

The magnetic field application mechanism 50 applies an external magnetic field to the independent magnetic body 60 and modulates a resonance frequency of the independent magnetic body 60. The signal output from the magnetoresistance effect device 100 fluctuates due to the resonance frequency of the independent magnetic body 60. For this reason, in order to vary the output signal, a magnetic field application mechanism is preferably further provided.

The magnetic field application mechanism 50 is preferably disposed in the vicinity of the independent magnetic body 60. The magnetic field application mechanism 50 is configured as, for example, an electromagnet type or a stripline type that can variably control an applied magnetic field intensity using either a voltage or a current. In addition, the magnetic field application mechanism 50 may be configured by a combination of an electromagnet type or a stripline type that can variably control the applied magnetic field intensity and a permanent magnet configured to supply only a constant magnetic field.

[Function of Magnetoresistance Effect Device]

When the high frequency signal is input to the magnetoresistance effect device 100 from the first port 1, the high frequency current corresponding to the high frequency signal flows through the first signal line 20. The high frequency current flowing through the first signal line 20 applies a high frequency magnetic field to the independent magnetic body 60.

The magnetization of the independent magnetic body 60 oscillates greatly when the high frequency magnetic field applied by the first signal line 20 is close to the resonance frequency of the independent magnetic body 60. The phenomenon is a ferromagnetic resonance phenomenon.

The magnetization of the independent magnetic body 60 produces a magnetic field. The magnetization of the magnetization free layer 12 of the magnetoresistance effect element 10 is moved by receiving an influence of the magnetic field produced by magnetization of the independent magnetic body 60. That is, when the magnetization of the independent magnetic body 60 is greatly oscillated, the produced magnetic field of the independent magnetic body 60 is also greatly varied, and the magnetization of the magnetization free layer 12 is greatly oscillated.

When the oscillation of the magnetization free layer 12 is increased, a resistance value variation in the magnetoresistance effect element 10 is increased. The resistance value variation of the magnetoresistance effect element 10 is output from the second port 2 as a potential difference between the lower electrode 14 and the upper electrode 15.

That is, when the high frequency signal input from the first port 1 is close to the resonance frequency of the independent magnetic body 60, a fluctuation amount of the resistance value of the magnetoresistance effect element 10 is large, and a large signal is output from the second port 2. On the other hand, when the high frequency signal has deviated from the resonance frequency of the independent magnetic body 60, a fluctuation amount of a resistance value of the magnetoresistance effect element 10 is small, and most of the signal is not output from the second port 2. That is, the magnetoresistance effect device 100 functions as a high frequency filter through which only a high frequency signal having a specified frequency can selectively pass.

In this way, the magnetoresistance effect device 100 oscillates the magnetization of the independent magnetic body 60 using the ferromagnetic resonance, and outputs the oscillation of the magnetization of the magnetization free layer 12 pulled by the oscillated magnetization as a signal mainly. Meanwhile, the high frequency magnetic field generated in the first signal line 20 is partially applied to also the magnetization free layer 12. For this reason, the magnetization of the magnetization free layer 12 may be oscillated independently from the magnetization of the independent magnetic body 60. Therefore, in order to increase the accuracy of the signal output from the magnetoresistance effect device 100, it is preferable to take the resonance frequency of the magnetization free layer 12 into consideration.

The resonance frequency is varied by the effective magnetic field in the magnetic body. An effective magnetic field $H_{\mathit{eff}}$ in the magnetic body is expressed by the following equation when an external magnetic field applied to the magnetic body is $H_E$, an anisotropic magnetic field in the magnetic body is $H_k$, an anti-magnetic field in the magnetic body is $H_D$, and an exchange coupling magnetic field in the magnetic body is $H_{EX}$.

$$H_{\mathit{eff}}=H_E+H_k+H_D+H_{EX} \quad (1)$$

For this reason, the resonance frequency of the independent magnetic body 60 and the resonance frequency of the magnetization free layer 12 may not coincide with each other. Hereinafter, a case in which the resonance frequency of the independent magnetic body 60 and the resonance frequency of the magnetization free layer 12 coincide with each other and a case in which they do not coincide with each other will be described in detail.

Figure 2:
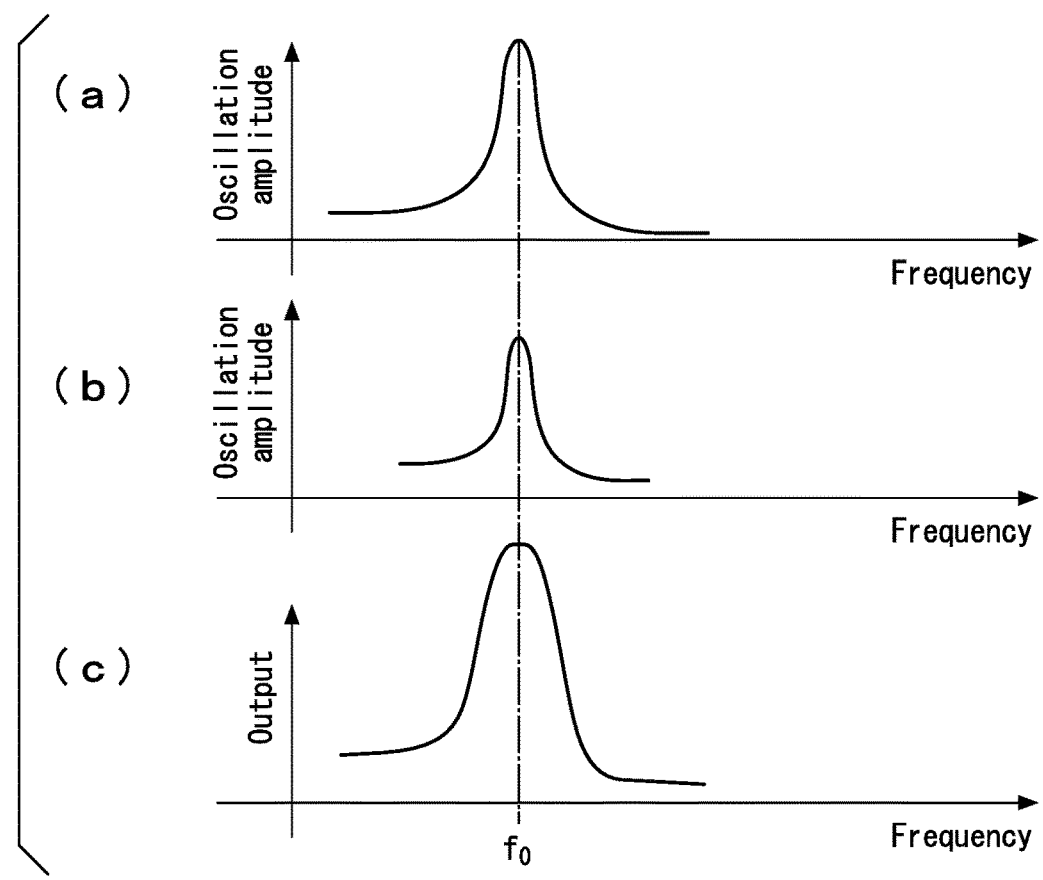
FIG. 2 is a view showing a relation of an oscillation amplitude and an output signal with respect to a period of a high frequency magnetic field applied to an independent magnetic body and a magnetization free layer when a resonance frequency of the independent magnetic body coincides with a resonance frequency of the magnetization free layer.

First, the case in which the resonance frequency of the independent magnetic body 60 and the resonance frequency of the magnetization free layer 12 coincide with each other will be described. FIG. 2 is a view showing a relation of an oscillation amplitude and an output signal with respect to a period of the high frequency magnetic field applied to the independent magnetic body 60 and the magnetization free layer 12. FIG. 2(*a*) shows an oscillation amplitude of the independent magnetic body 60, FIG. 2(*b*) shows an oscillation amplitude of the magnetization free layer 12, and FIG. 2(*c*) shows an output signal output from the magnetoresistance effect device 100.

The magnetization of the independent magnetic body 60 has a large ferromagnetic resonance at the resonance frequency $f_0$. For this reason, as shown in FIG. 2(*a*), the magnetization of the independent magnetic body 60 close to the resonance frequency $f_0$ shows a large oscillation, and shows almost no oscillation at other frequencies.

In addition, the magnetization of the magnetization free layer 12 is greatly oscillated by being affected by the magnetic field produced by the magnetization of the independent magnetic body 60. In addition, the magnetization free layer 12 is also affected by the magnetic field output from the first signal line 20. Even when a high frequency magnetic field applied to the magnetoresistance effect element 10 by the first signal line 20 is close to the resonance frequency of the magnetization free layer 12, the magnetization of the magnetization free layer 12 is greatly oscillated.

As shown in FIG. 2(*b*), a resonance frequency $f_0$ of the magnetization free layer 12 and a resonance frequency $f_0$ of the independent magnetic body 60 coincide with each other. For this reason, as shown in FIG. 2(*b*), the magnetization of the magnetization free layer 12 is greatly oscillated only at the resonance frequency $f_0$.

The magnetoresistance effect device 100 outputs the resistance value variation of the magnetoresistance effect element 10. The resistance value variation of the magnetoresistance effect element 10 is generated by a relative variation between magnetization directions of the magnetization fixed layer 11 and the magnetization free layer 12. For this reason, the magnetoresistance effect device 100 outputs a large signal at the resonance frequency $f_0$ on which the magnetization of the magnetization free layer 12 is greatly oscillated.

Figure 3:
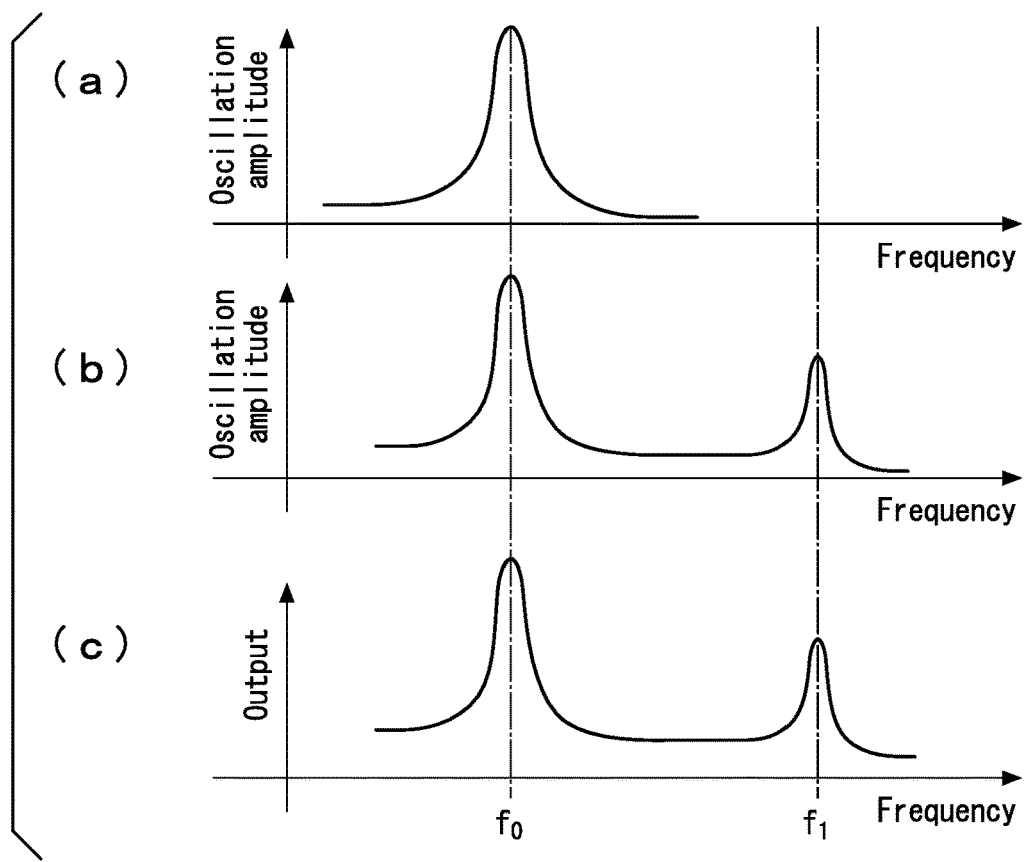
FIG. 3 is a view showing a relation of an oscillation amplitude and an output signal with respect to a period of a high frequency magnetic field applied to the independent magnetic body and the magnetization free layer when a resonance frequency of the independent magnetic body is different from a resonance frequency of the magnetization free layer.

Next, a case in which a resonance frequency of the independent magnetic body 60 and a resonance frequency of the magnetization free layer 12 are different will be described. FIG. 3 is a view showing a relation of an oscillation amplitude and an output signal with respect to a period of a high frequency magnetic field applied to the independent magnetic body 60 and the magnetization free layer 12. FIG. 3(a) shows an oscillation amplitude of the independent magnetic body 60, FIG. 3(b) shows an oscillation amplitude of the magnetization free layer 12, and FIG. 3(c) shows an output signal output from the magnetoresistance effect device 100.

The magnetization of the independent magnetic body 60 is a large ferromagnetic resonance at the resonance frequency $f_0$. For this reason, as shown in FIG. 3(a), the magnetization of the independent magnetic body 60 shows a large oscillation around the resonance frequency $f_0$, and shows almost no oscillation at another frequency.

Meanwhile, the magnetization of the magnetization free layer 12 is oscillated by receiving an influence from the independent magnetic body 60 and an influence from the first signal line 20. The magnetization of the independent magnetic body 60 is oscillated at the resonance frequency $f_0$, and produces a magnetic field. The magnetic field oscillates the magnetization of the magnetization free layer 12. As a result, the magnetization of the magnetization free layer 12 is oscillated at the resonance frequency $f_0$.

In addition, the magnetization of the magnetization free layer 12 is oscillated even around the resonance frequency $f_1$ of the magnetization free layer 12. The oscillation is generated as the high frequency magnetic field applied to the magnetoresistance effect element 10 by the first signal line 20 causes the magnetization and the ferromagnetic resonance of the magnetization free layer 12.

Accordingly, as shown in FIG. 3(b), the magnetization of the magnetization free layer 12 is oscillated at the resonance frequency $f_0$ of the independent magnetic body 60 and a resonance frequency $f_1$ of the magnetization free layer 12. For this reason, as shown in FIG. 3(c), the magnetoresistance effect device 100 outputs a large signal at the resonance frequency $f_0$ of the independent magnetic body 60 and the resonance frequency $f_1$ of the magnetization free layer 12.

In this way, there is a different in the output signal between when the resonance frequency of the independent magnetic body 60 and the resonance frequency of the magnetization free layer 12 coincide with each other and when they do not coincide with each other.

When the resonance frequency of the independent magnetic body 60 and the resonance frequency of the magnetization free layer 12 coincide with each other, the magnetization of the magnetization free layer 12 is greatly oscillated by receiving an influence obtained by overlapping the influence from the independent magnetic body 60 and the influence from the first signal line 20. That is, it is advantageous that, when the resonance frequencies coincide with each other, a signal output from the magnetoresistance effect device 100 is increased.

Meanwhile, when the resonance frequency of the independent magnetic body 60 and the resonance frequency of the magnetization free layer 12 are different from each other, the magnetoresistance effect device 100 capable of outputting two signals can be realized. In addition, it is also possible to determine one output signal by decreasing one of the signals output to the outside using the low pass filter.

When the low pass filter is used, the resonance frequency $f_0$ of the independent magnetic body 60 is preferably smaller than the resonance frequency $f_1$ of the magnetization free layer 12, and it is preferable to use the low pass filter configured to allow a frequency smaller than the resonance frequency $f_1$ of the magnetization free layer 12 to pass therethrough. When the effective magnetic field in the independent magnetic body 60 is smaller than the effective magnetic field in the magnetization free layer 12, the resonance frequency $f_0$ of the independent magnetic body 60 may be smaller than the resonance frequency $f_1$ of the magnetization free layer 12 (see Equation (1)).

The magnetization free layer 12 has a small volume and a small magnetic moment. For this reason, an influence such as heat or the like is easily exerted, and a thermal fluctuation or the like exerts an influence to the oscillation of the magnetization of the magnetization free layer 12. It is said that the influence of the thermal fluctuation is increased around the resonance frequency $f_1$ of the magnetization free layer 12. That is, the output signal around the resonance frequency $f_1$ of the magnetization free layer 12 shown in FIG. 3(c) includes a large amount of noises. Since the signal including a large amount of noises is blocked by the low pass filter, only an output signal having a small amount of noises (an output signal around the resonance frequency $f_0$ of the independent magnetic body 60) can be extracted.

Since the low pass filter is used in this way, an influence of the noises can be minimized. Meanwhile, when the magnetic moment of the independent magnetic body 60 is sufficiently larger than the magnetic moment of the magnetization free layer 12, an influence applied to the magnetization of the magnetization free layer 12 by the independent magnetic body 60 is increased, and an influence applied to the magnetization of the magnetization free layer 12 by the first signal line 20 is decreased. That is, an output signal around the resonance frequency $f_0$ of the independent magnetic body 60 in FIG. 3(b) is increased, and an output signal around the resonance frequency $f_1$ of the magnetization free layer 12 is decreased. For this reason, even when the noise is not blocked using the low pass filter, the noise can be decreased to a level that can be sufficiently neglected. This is also similar to the case in which the resonance frequency of the independent magnetic body 60 and the resonance frequency of the magnetization free layer 12 coincide with each other.

<Modulation of Resonance Frequency>

A frequency selected by the magnetoresistance effect device 100 can be modulated by varying a resonance frequency of the magnetization free layer 12. The resonance frequency is varied by the effective magnetic field in the magnetization free layer 12.

Figure 4:
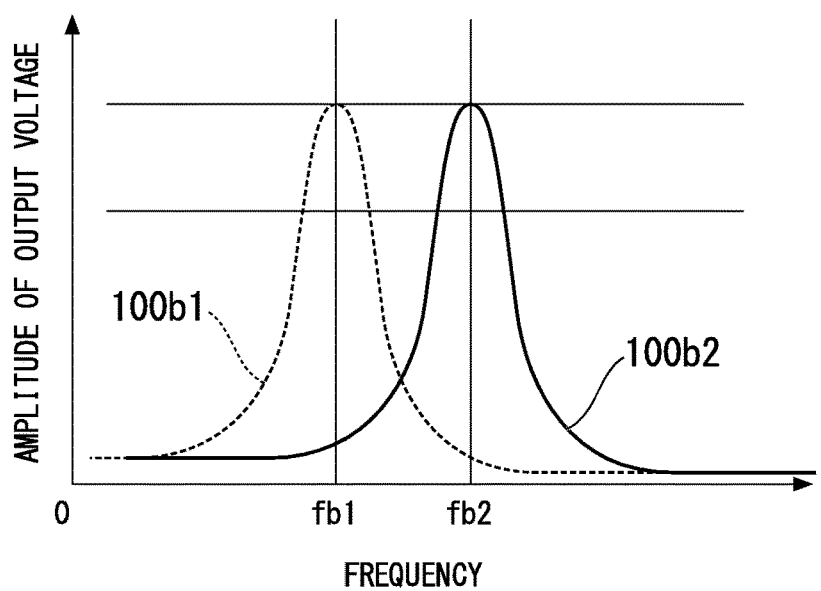
FIG. 4 is a view showing a relation between a frequency of a high frequency signal input to the magnetoresistance effect device and an amplitude of a voltage output from the magnetoresistance effect device when a direct current applied to the magnetoresistance effect element is constant.

As shown in Equation (1), the effective magnetic field in the magnetization free layer 12 is affected by an external magnetic field $H_E$. A magnitude of the external magnetic field $H_E$ can be adjusted by the magnetic field application mechanism 50. FIG. 4 is a view showing a relation between a frequency of a high frequency signal input to the magnetoresistance effect device 100 and an amplitude of a voltage output therefrom when a direct current applied to the magnetoresistance effect element 10 is constant.

When an arbitrary external magnetic field is applied to the independent magnetic body 60, the resonance frequency of the independent magnetic body 60 is varied by receiving an influence of the external magnetic field. The resonance frequency at this time is fb1. Since the resonance frequency of the independent magnetic body 60 is fb1, an amplitude of an output voltage when the frequency of the high frequency signal input to the magnetoresistance effect device 100 is fb1 is increased (see FIG. 2 and FIG. 3). For this reason, a graph of a plot line 100b1 shown in FIG. 4 is obtained.

Next, when the applied external magnetic field is increased, an influence of the external magnetic field is received and the resonance frequency is shifted from fb1 to fb2. Here, the frequency at which the amplitude of the output voltage is increased is shifted from fb1 to fb2. As a result, a graph of a plot line 100b2 shown in FIG. 4 is obtained. In this way, the magnetic field application mechanism 50 can adjust an effective magnetic field $H_{eff}$ applied to the independent magnetic body 60, and modulate the resonance frequency.

Meanwhile, the magnetic field application mechanism 50 applies a magnetic field to both of the independent magnetic body 60 and the magnetoresistance effect element 10. For this reason, even when the resonance frequency of the independent magnetic body 60 and the resonance frequency of the magnetization free layer 12 can be simultaneously modulated, it is difficult to vary a relationship between the resonance frequencies. That is, it is difficult to vary a frequency difference between the resonance frequency $f_0$ and the resonance frequency $f_1$ in FIG. 3(c). Here, a means configured to independently modulate only the resonance frequency of the magnetization free layer 12 will be described.

A first means is to provide a bias magnetic layer configured to apply an external magnetic field to the magnetization free layer 12 of the magnetoresistance effect element 10. A size of the magnetoresistance effect element 10 is about several hundreds of nm, and a thickness of the magnetization free layer 12 is about several nm. For this reason, in order to apply a magnetic field to the magnetization free layer 12 without exerting an influence to the independent magnetic body 60, a source having an extremely small magnetic field is needed.

A bias magnetic layer is a magnetic film having magnetism. The bias magnetic layer is obtained by laminating a magnetic film on the vicinity of the magnetization free layer 12. The bias magnetic layer can apply a magnetic field to the magnetization free layer 12 without exerting an influence to the independent magnetic body 60. When a magnetic field is applied to the magnetization free layer 12 by the bias magnetic layer, the resonance frequency $f_1$ of the magnetization free layer 12 is increased. As a result, a frequency difference between the resonance frequency $f_0$ of the independent magnetic body 60 and the resonance frequency $f_1$ of the magnetization free layer 12 can be increased. When the frequency difference therebetween is increased, isolation of the signal is facilitated by the low pass filter or the like.

Figure 5:
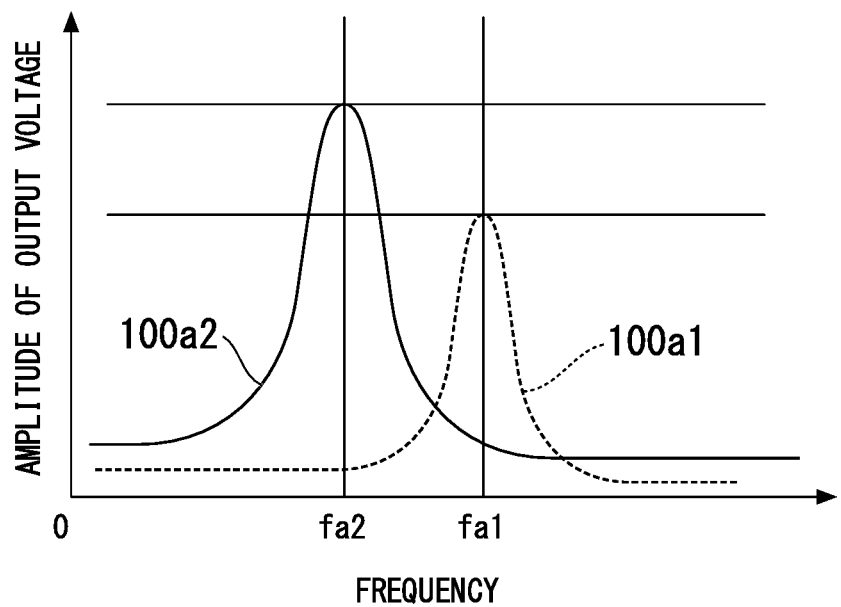
FIG. 5 is a view showing a relation between a frequency of a high frequency signal input to the magnetoresistance effect device and an amplitude of a voltage output from the magnetoresistance effect device when an external magnetic field applied to the magnetoresistance effect element is constant.

Next, a second means is to vary a current density of a direct current applied to the magnetoresistance effect element 10 from the power supply 41. FIG. 5 is a view showing a relation between a frequency of a high frequency signal input to the magnetoresistance effect device 100 and an amplitude of a voltage output therefrom when an external magnetic field applied to the magnetoresistance effect element 10 is constant. Here, a direct current flows to the magnetoresistance effect element 10, and there is no influence to the independent magnetic body 60. For this reason, "an amplitude of an output voltage" disclosed herein is obtained according to the resonance frequency $f_1$ of the magnetization free layer 12 (see FIG. 3(b)), and is not obtained according to the resonance frequency $f_0$ of the independent magnetic body 60.

The output voltage output from the second port 2 of the magnetoresistance effect device 100 is expressed as a product of a resistance value oscillated in the magnetoresistance effect element 10 and a direct current flowing through the magnetoresistance effect element 10. When the direct current flowing through the magnetoresistance effect element is increased, an amplitude (an output signal) of the output voltage is increased.

In addition, when a direct current amount flowing to the magnetoresistance effect element 10 is varied, a state of the magnetization in the magnetization free layer 12 is varied, and magnitudes of an anisotropic magnetic field $H_k$, an anti-magnetic field $H_D$ and a magnetic exchange coupling magnetic field $H_{EX}$ in the magnetization free layer 12 are varied. As a result, the resonance frequency is decreased when the direct current is increased. That is, when a direct current amount is increased as shown in FIG. 5, the amplitude of the output voltage is shifted from a plot line 100a1 to a plot line 100a2. In this way, since the amount of the current applied to the magnetoresistance effect element 10 from the power supply 41 is varied, the resonance frequency of the magnetization free layer 12 can be modulated. When the resonance frequency $f_1$ of the magnetization free layer 12 can be modulated, a frequency difference between the resonance frequency $f_0$ of the independent magnetic body 60 and the resonance frequency $f_1$ of the magnetization free layer 12 can be increased, and isolation of the signal is facilitated by the low pass filter or the like.

<Another Use>

In addition, while the case in which the magnetoresistance effect device is used as the high frequency filter as described above has been exemplarily provided, the magnetoresistance effect device may be used as a high frequency device such as an isolator, a phase shifter, an amplifier (an amp), or the like.

When the magnetoresistance effect device is used as the isolator, a signal is input from the second port 2. Since there is no signal output from the first port 1 even when the signal is input from the second port 2, the device functions as the isolator.

In addition, when the magnetoresistance effect device is used as the phase shifter, in the case in which the output frequency band is varied, it is focused to a frequency of an arbitrary point in the output frequency band. When the output frequency band is varied, since a phase in a specified frequency is varied, the device functions as the phase shifter.

In addition, when the magnetoresistance effect device is used as the amplifier, the resistance value variation of the magnetoresistance effect element 10 is increased. The resistance value variation of the magnetoresistance effect element 10 is increased as the direct current input from the power supply 41 becomes a predetermined magnitude or more or the independent magnetic body 60 increases the high frequency magnetic field applied to the magnetoresistance effect element 10. When the resistance value variation of the magnetoresistance effect element 10 is increased, the signal output from the second port 2 is larger than the signal input from the first port 1, and functions as an amplifier.

As described above, the magnetoresistance effect device 100 according to the first embodiment may function as a high frequency device such as a high frequency filter, an isolator, a phase shifter, an amplifier, or the like.

As described above, the magnetoresistance effect device 100 according to the embodiment moves the magnetization of the magnetization free layer 12 using the magnetic field generated due to the oscillation of the magnetization of the independent magnetic body 60. Since the independent magnetic body 60 having a large magnetic moment is used, the magnetization of the magnetization free layer 12 can reduce an influence of the noise generated by the oscillation due to the thermal fluctuation or the like.

In addition, when the resonance frequency of the independent magnetic body 60 and the resonance frequency of the magnetization free layer are different from each other, the output signal around the resonance frequency of the magnetization free layer that can be easily affected by the noise can be blocked by the low pass filter or the like, and the magnetoresistance effect device 100 having a smaller amount of noise can be realized.

Hereinafter, while the preferred embodiment of the present disclosure has been described in detail, the present disclosure is not limited to the specific embodiment and various modifications and changes may be made without departing from the spirit of the present disclosure disclosed in the following claims.

Figure 6:
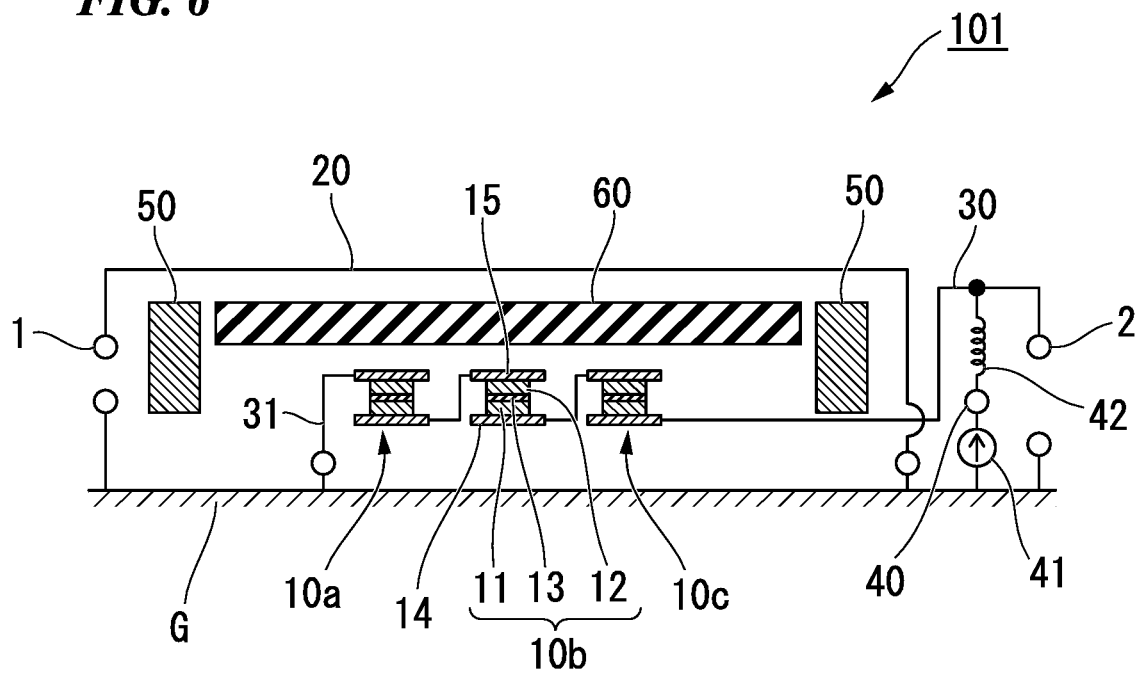
FIG. 6 is a view schematically showing an example of a circuit configuration of a magnetoresistance effect device including a plurality of magnetoresistance effect elements.

For example, the magnetoresistance effect device may have a plurality of magnetoresistance effect elements 10. FIG. 6 is a view schematically showing an example of a circuit configuration of a magnetoresistance effect device including a plurality of magnetoresistance effect elements.

In a magnetoresistance effect device 101 shown in FIG. 6, three magnetoresistance effect elements (a first magnetoresistance effect element 10a, a second magnetoresistance effect element 10b and a third magnetoresistance effect element 10c) are disposed with respect to one independent magnetic body 60. The first magnetoresistance effect element 10a, the second magnetoresistance effect element 10b and the third magnetoresistance effect element 10c are disposed in series in a closed circuit constituted by the power supply 41, the output signal line 30, the third signal line 31 and the ground G.

The magnetoresistance effect elements are similarly oscillated by the magnetic field applied from the one independent magnetic body 60. For this reason, the signal output from the second port 2 is a sum of the output signals from the magnetoresistance effect elements 10. That is, according to the magnetoresistance effect device 101 shown in FIG. 6, the output signal can be increased.

Figure 7:
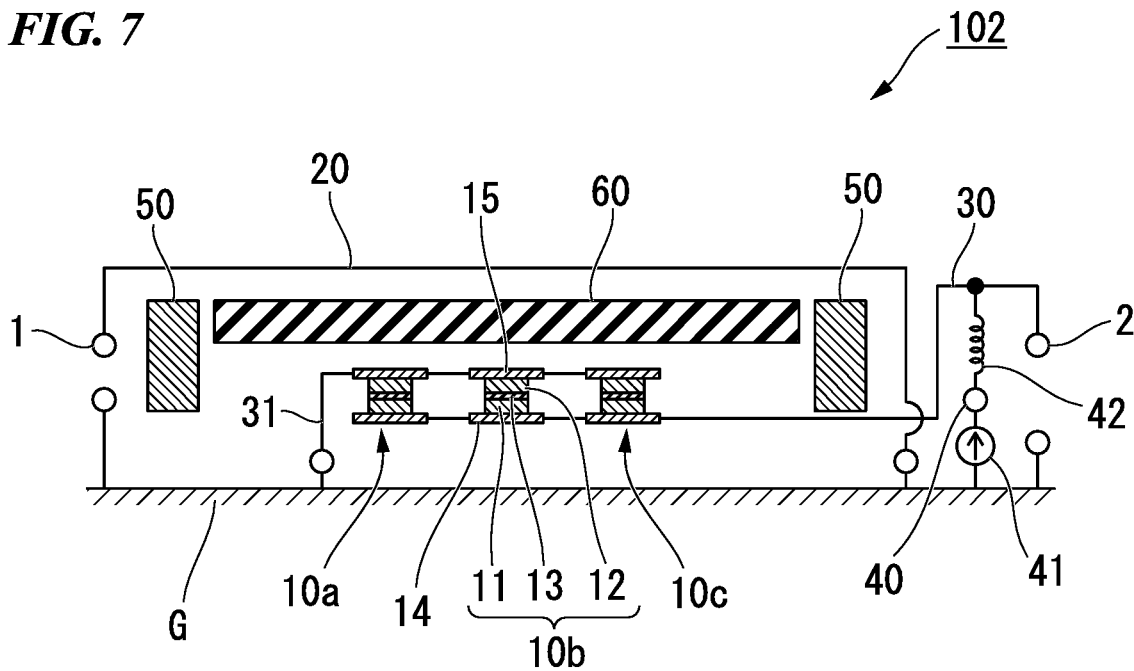
FIG. 7 is a view schematically showing another example of a circuit configuration of a magnetoresistance effect device including a plurality of magnetoresistance effect elements.

In addition, FIG. 7 is a view schematically showing another example of a circuit configuration of a magnetoresistance effect device including a plurality of magnetoresistance effect elements. In a magnetoresistance effect device 102 shown in FIG. 7, three magnetoresistance effect elements (a first magnetoresistance effect element 10a, a second magnetoresistance effect element 10b and a third magnetoresistance effect element 10c) are disposed with respect to one independent magnetic body 60 and arranged parallel to the direct current application terminal 40 to which the power supply 41 is connected.

Also in the case of the serial arrangement or the parallel arrangement, the output voltage variation reads a variation of a combined resistance of the elements. In the case of the parallel arrangement, a combined resistance value is reduced as the number of the parallelly arranged sensors is increased. Accordingly, in the case of the parallel arrangement, while the output signal is not increased, accuracy of the output signal can be improved. That is, the magnetoresistance effect device 102 shown in FIG. 7 can obtain a signal having a small amount of noise.

Figure 8:
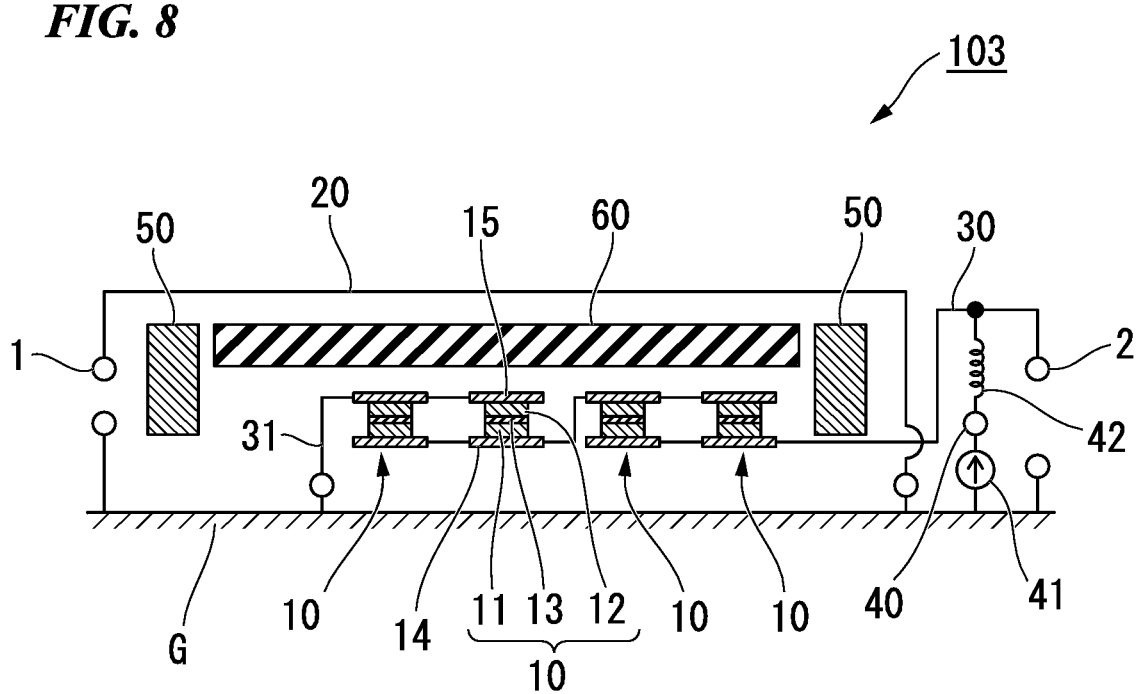
FIG. 8 is a view schematically showing another example of a circuit configuration of a magnetoresistance effect device including a plurality of magnetoresistance effect elements.
Figure 9:
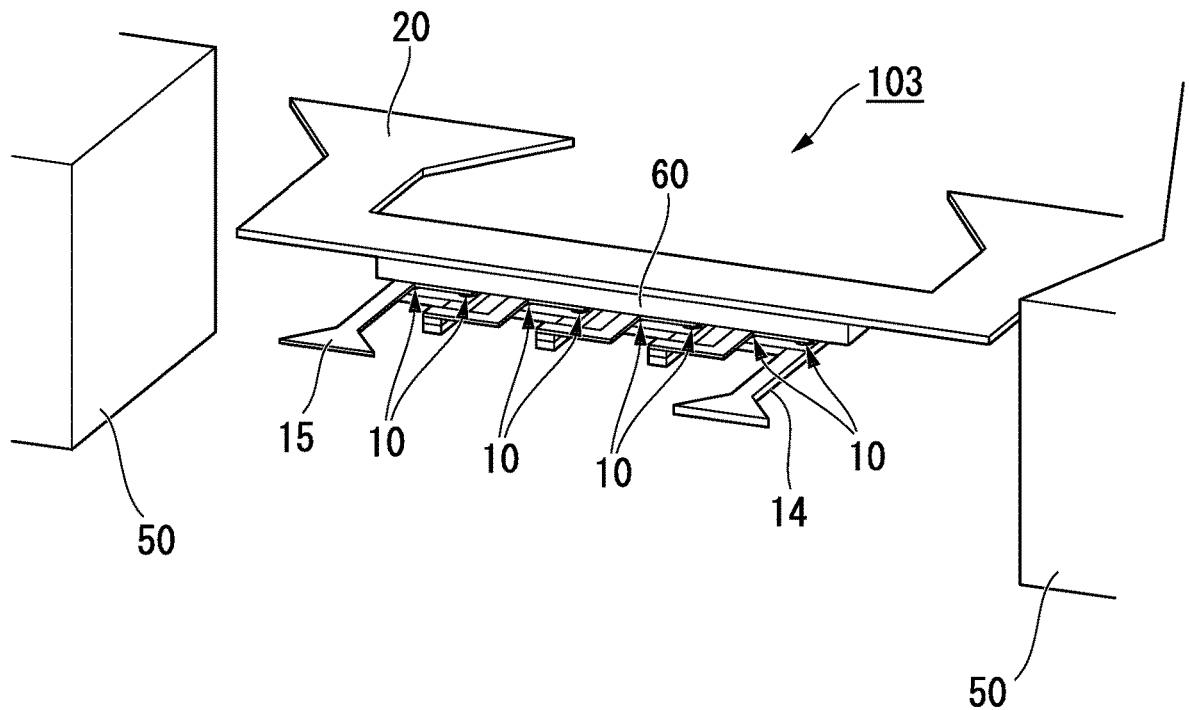
FIG. 9 is a perspective view of another example of a circuit configuration of magnetoresistance effect device including a plurality of magnetoresistance effect elements.

In addition, FIG. 8 is a view schematically showing another example of a circuit configuration of a magnetoresistance effect device including a plurality of magnetoresistance effect element. A magnetoresistance effect device 103 shown in FIG. 8 has a structure in which the magnetoresistance effect elements are combined in the parallel arrangement and the serial arrangement with respect to the power supply 41. In addition, FIG. 9 is a perspective view of another example of a circuit configuration of a magnetoresistance effect device including a plurality of magnetoresistance effect elements. In FIG. 9, two magnetoresistance effect elements 10 that are arranged in parallel are disposed in series to four sets with respect to a power supply (not shown).

As shown in FIG. 8 and FIG. 9, when the magnetoresistance effect elements 10 that are arranged in series and in parallel with the power supply 41 are combined, advantages thereof may be overlapped. While an internal resistance of the magnetoresistance effect elements 10 cannot be neglected in the serial arrangement, an influence of the internal resistance can be reduced by combining the sensors 10 in the parallel arrangement. In addition, the case in which the power supply 41 and the direct current application terminal 40 are provided each solely has been exemplarily described in the above-mentioned example, a plurality of power supplies 41 and a plurality of direct current application terminals 40 may be provided. In this case, the plurality of power supplies 41 and the plurality of direct current application terminals 40 are connected to the magnetoresistance effect elements 10, respectively, and a direct current or a direct current voltage is applied to each of the magnetoresistance effect elements 10. In addition, even in this case, the one power supply 41 and the one direct current application terminal 40 may be shared by the plurality of magnetoresistance effect elements 10.

In addition, in FIG. 6 to FIG. 9, while the case in which the plurality of magnetoresistance effect elements are installed with respect to the one independent magnetic body 60 has been described, the independent magnetic body 60 may be disposed with respect to each of the magnetoresistance effect elements.

Figure 10:
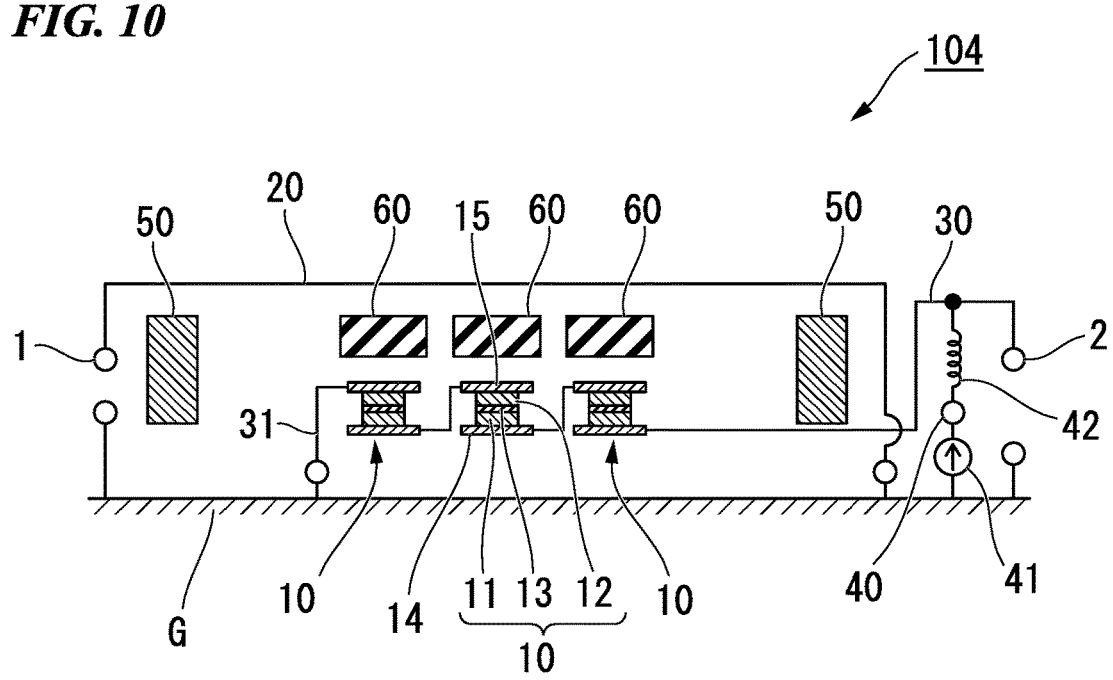
FIG. 10 is a view schematically showing an example of a circuit configuration of a magnetoresistance effect device in which a plurality of magnetoresistance effect elements and a plurality of independent magnetic bodies are provided, and one independent magnetic body is installed with respect to one magnetoresistance effect element.

FIG. 10 is a view schematically showing an example of a circuit configuration of a magnetoresistance effect device in which a plurality of magnetoresistance effect elements and a plurality of independent magnetic bodies are provided, and one independent magnetic body is installed with respect to one magnetoresistance effect element.

The resonance frequencies of the independent magnetic bodies 60 installed on the magnetoresistance effect elements 10 are preferably different from each other. The resonance frequency of the independent magnetic body 60 can be controlled by varying a shape in a plan view when seen in the lamination direction. When the plurality of independent magnetic bodies 60 having different resonance frequencies are used, the independent magnetic bodies 60 are oscillated at the resonance frequencies, respectively, and the magnetoresistance effect elements installed in the vicinity thereof show large resistance value variations at the resonance frequencies, respectively. Then, a value obtained by summing them is output from the second port 2. For this reason, a frequency in a range in which the resonance frequencies overlap is a selected frequency of a magnetoresistance effect device 104, and a band of the selected frequency is widened.

The magnetic field application mechanism 50 may be one shared by the independent magnetic bodies 60 (see FIG. 10) or may be installed at each of them. When the magnetic field application mechanisms 50 are installed with respect to the magnetoresistance effect elements, respectively, while integration of the magnetoresistance effect device 104 is decreased, a degree of setting freedom of a selected frequency of the magnetoresistance effect device 104 is increased. While the case of the serial arrangement with respect to the power supply 41 has been shown in FIG. 10, it is also the same in any one of parallel arrangement, and a combination of serial arrangement and parallel arrangement.

Figure 11:
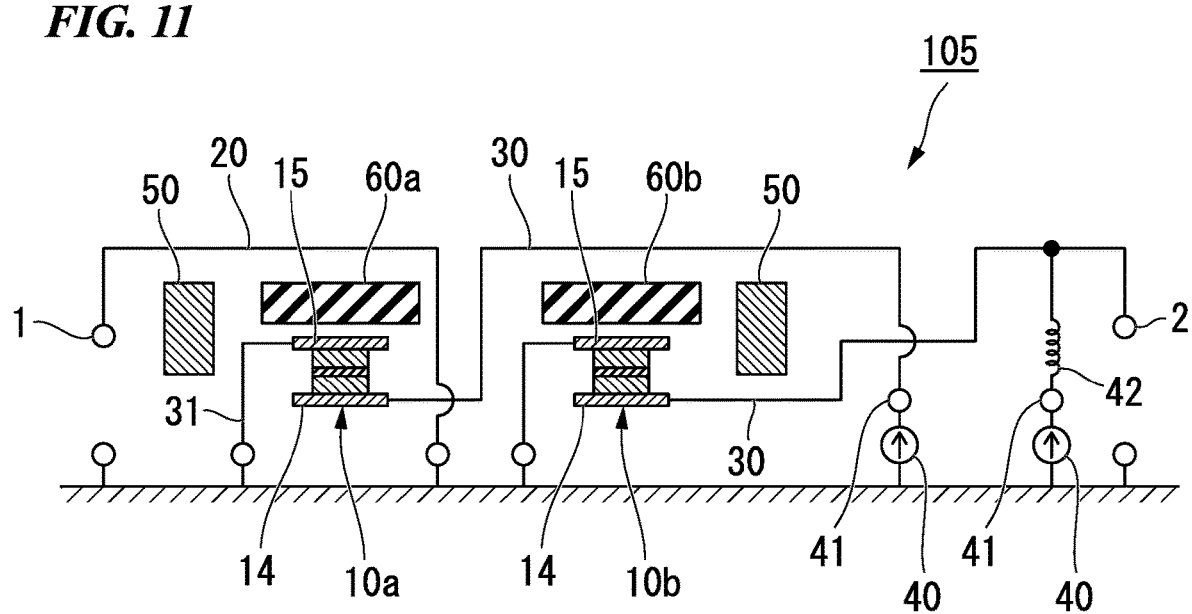
FIG. 11 is a view schematically showing another example of a circuit configuration of a magnetoresistance effect device including a plurality of magnetoresistance effect elements.

In addition, FIG. 11 is a view schematically showing another example of a circuit configuration of a magnetoresistance effect device including a plurality of magnetoresistance effect elements. A magnetoresistance effect device 105 shown in FIG. 11 includes a first magnetoresistance effect element 10a, a second magnetoresistance effect element 10b, a first independent magnetic body 60a and a second independent magnetic body 60b.

A high frequency magnetic field generated in the first independent magnetic body 60a is applied to the first magnetoresistance effect element 10a, and a high frequency magnetic field generated in the second independent magnetic body 60b is applied to the second magnetoresistance effect element 10b. The magnetization of the first independent magnetic body 60a produces a high frequency magnetic field by receiving the high frequency magnetic field generated in the first signal line 20, and the magnetization of the second independent magnetic body 60b produces a high frequency magnetic field by receiving the high frequency magnetic field generated in the output signal line 30.

A high frequency signal input to the magnetoresistance effect device 105 from the first port 1 is filtered by the first magnetoresistance effect element 10a. The filtered high frequency signal is output from the output signal line 30. The high frequency signal is filtered by the second magnetoresistance effect element 10b, and output to the outside of the magnetoresistance effect device 105 from the second port 2. That is, a signal input from the first port 1 of the magnetoresistance effect device 105 is filtered by two times until the signal is output from the second port 2. Accordingly, according to the magnetoresistance effect device 105, filtering accuracy of the high frequency signal can be improved.

In addition, the number of the magnetoresistance effect elements is not limited to two, and a larger number of elements may be provided. In this case, a high frequency magnetic field from the first signal line is applied to at least one of the plurality of magnetoresistance effect elements, and a high frequency magnetic field from the output signal line output from another magnetoresistance effect element is applied to the remaining magnetoresistance effect elements. As the number of the magnetoresistance effect elements is increased, filtering accuracy of the high frequency signal is further improved.

Figure 12:
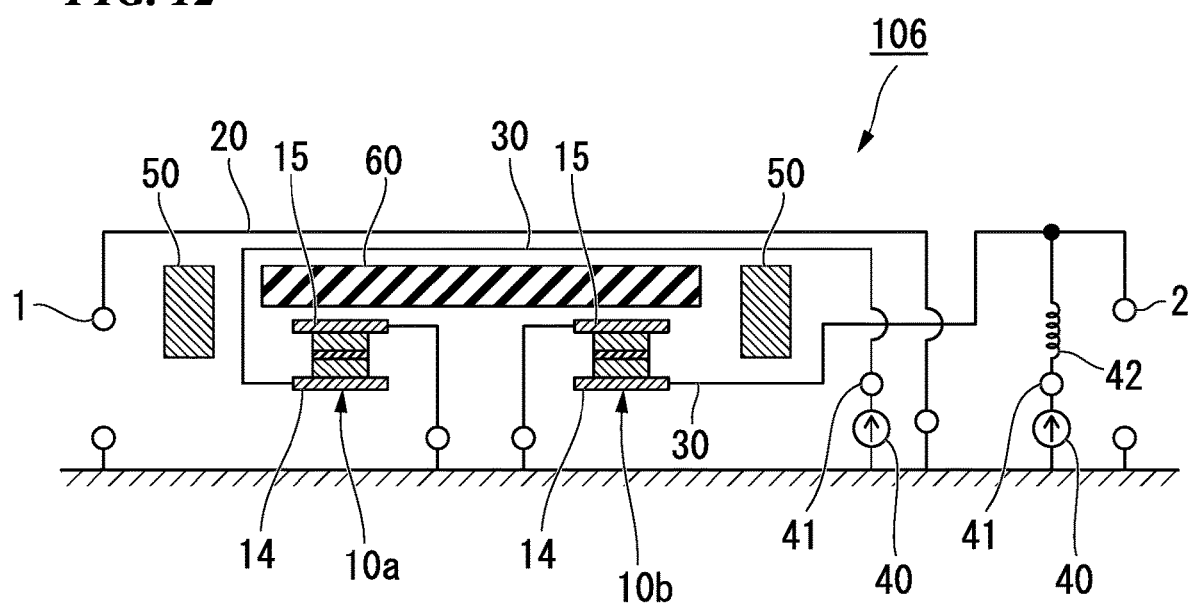
FIG. 12 is a view schematically showing another example of a circuit configuration of a magnetoresistance effect device including a plurality of magnetoresistance effect elements.

In addition, even in the configuration of the magnetoresistance effect device 105 shown in FIG. 11, one independent magnetic body may be provided for each of the magnetoresistance effect elements. FIG. 12 is a view schematically showing another example of a circuit configuration of a magnetoresistance effect device including a plurality of magnetoresistance effect elements. In a magnetoresistance effect device 106 shown in FIG. 12, one independent magnetic body 60 is disposed with respect to the first magnetoresistance effect element 10a and the second magnetoresistance effect element 10b.

Magnetization of the second magnetoresistance effect element 10b is oscillated by receiving influences of the first signal line 20, the independent magnetic body 60 and the output signal line 30. A high frequency current flowing through the output signal line 30 is filtered by the first magnetoresistance effect element 10a. That is, a high frequency magnetic field fed back by the first magnetoresistance effect element 10a is applied to the second magnetoresistance effect element 10b. When the feedback is repeated, the same effect as that when the filtering is performed a plurality of times (FIG. 11) is obtained, accuracy of the output signal can be improved.

EXAMPLES

Example 1

Magnitudes of an output voltage and a noise output voltage output from the magnetoresistance effect device were measured through simulation. It has been confirmed that the simulation has a good correspondence relation with measured values.

Figure 13:
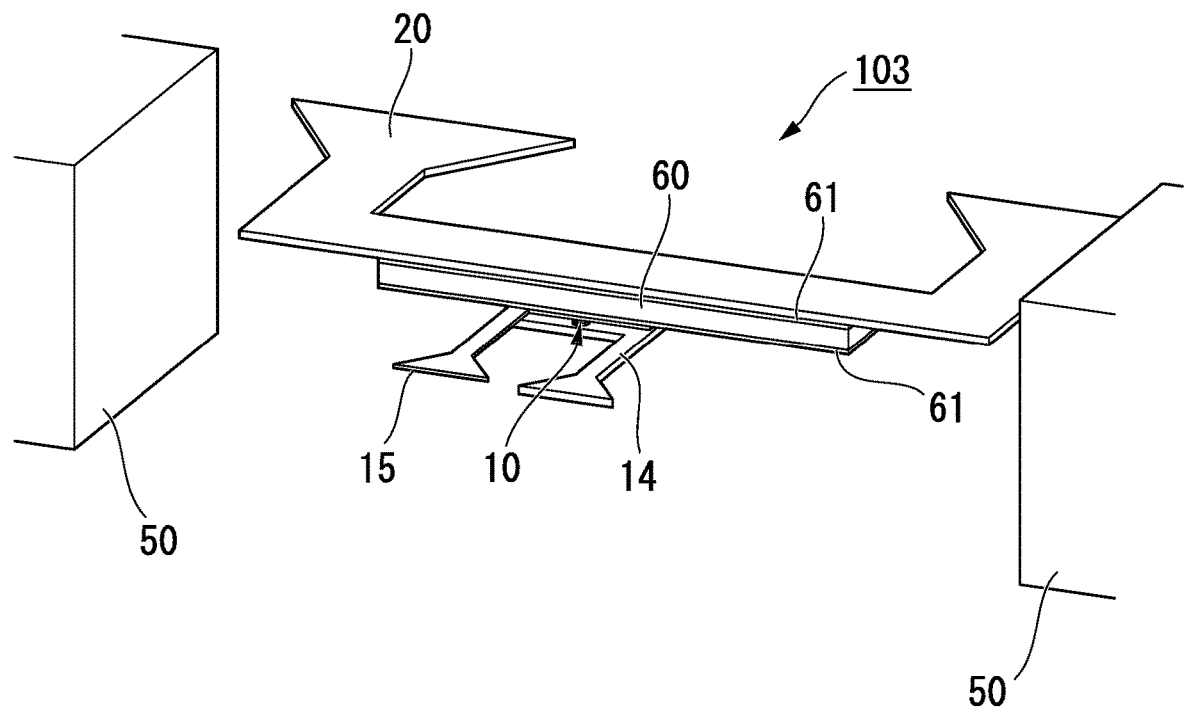
FIG. 13 is an enlarged schematic view of a major part of a magnetoresistance effect device of Example 1.

FIG. 13 is an enlarged schematic view of a major part of a magnetoresistance effect device of Example 1. The magnetoresistance effect element 10 was formed in a cylindrical shape having a diameter of 200 nm and a thickness of 25 nm. In addition, a thickness of the lower electrode 14 was 100 nm and a thickness of the upper electrode 15 was 50 nm. Then, the independent magnetic body 60 was disposed between the first signal line 20 and the upper electrode 15 via insulating layers 61. The independent magnetic body 60 was formed to have a thickness of 200 nm and a length of 10 μm. A thickness of the insulating layer 61 was 50 nm. Further, the first signal line 20 was formed to have a thickness of 100 nm and a width of 1 μm.

In addition, the saturation magnetization Ms of the independent magnetic body 60 was 0.77 kOe, and a damping constant α was 0.015. The condition corresponds to a case in which NiFe (permalloy) is used as the independent magnetic body 60. Further, the saturation magnetization Ms of the magnetization free layer of the magnetoresistance effect element 10 was 1.5 kOe, and the damping constant α was 0.02. The condition corresponds to the case in which CoFeB is used as the magnetization free layer. In addition, a bias magnetic field $H_{ext}$ of 192 Oe was applied to the independent magnetic body 60 and the magnetization free layer by the external magnetic field application mechanism.

Figure 14:
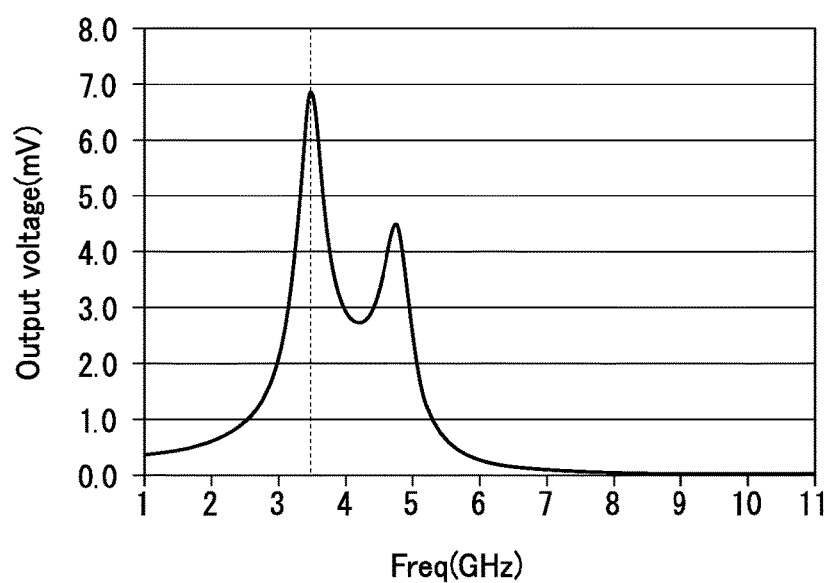
FIG. 14 shows a result of an output voltage of the magnetoresistance effect device according to Example 1.
Figure 15:
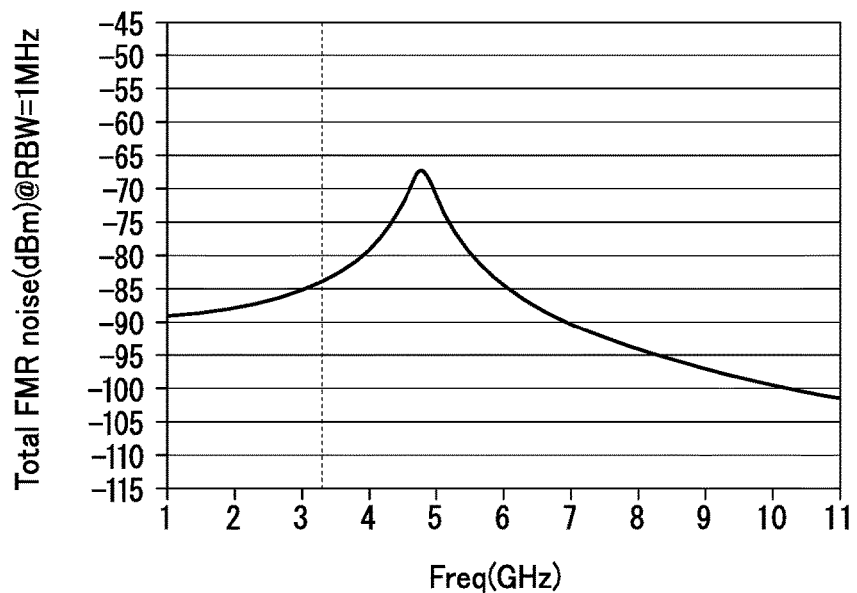
FIG. 15 shows a result of a noise output electric power of the magnetoresistance effect device according to Example 1.

When a voltage of 5 mV (−36 dBM as electric power) was input to the magnetoresistance effect device and a characteristic impedance was 50Ω, the output voltage and the noise output electric power were calculated through simulation. The result is shown in FIG. 14 and FIG. 15. FIG. 14 shows a result of the output voltage of the magnetoresistance effect device according to Example 1, and FIG. 15 shows a result of the noise output electric power of the magnetoresistance effect device according to Example 1.

As shown in FIG. 14, in the output voltage of the magnetoresistance effect device according to Example 1, two peaks were seen at 3.4 GHz and 4.8 GHz. The peak at 3.4 GHz is provided according to the ferromagnetic resonance of the independent magnetic body 60, and the peak at 4.8 GHz is provided according to the ferromagnetic resonance of the magnetization free layer. Since the magnitude of the saturation magnetization Ms differs in the independent magnetic body 60 and the magnetization free layer, the ferromagnetic resonance frequencies are also different from each other.

In the noise output voltage, as shown in FIG. 15, a peak was seen at 4.8 GHz. The peak is considered to be caused by a large thermal fluctuation of the magnetization around the resonance frequency of the magnetization free layer. Meanwhile, the independent magnetic body 60 has a volume 32,000 times the magnetization free layer. For this reason, the magnetization is rarely shaken under the influence of heat and the like, and almost no noise derived from the independent magnetic body 60 was observed.

That is, when the low pass filter through which a frequency of 4.0 GHz or less can pass is installed in the magnetoresistance effect device of Example 1, a high frequency signal having a small amount of noise can be extracted.

Comparative Example 1

Figure 16:
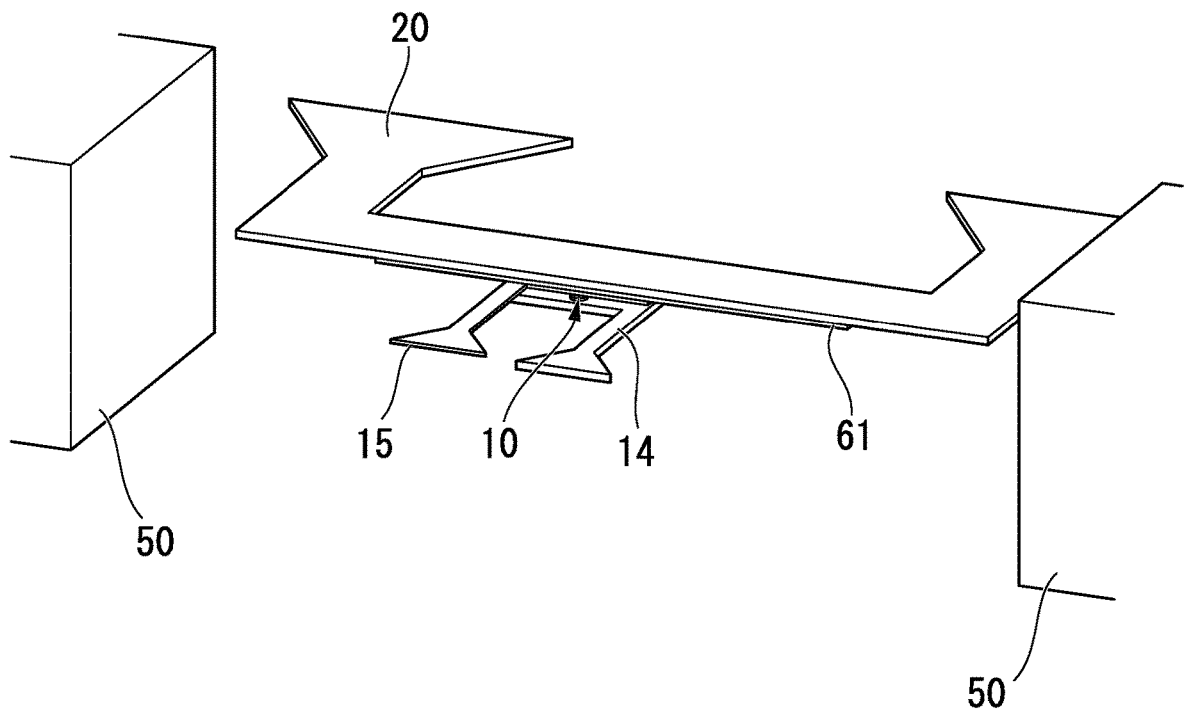
FIG. 16 is an enlarged schematic view of a major part of a magnetoresistance effect device of Comparative example 1.
Figure 17:
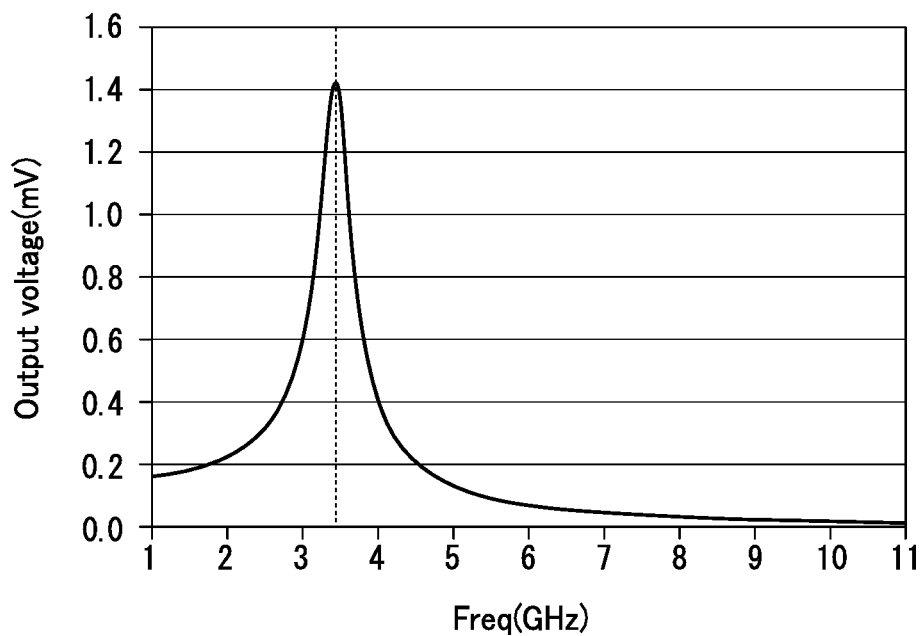
FIG. 17 shows a result of an output voltage of the magnetoresistance effect device according to Comparative example 1.
Figure 18:
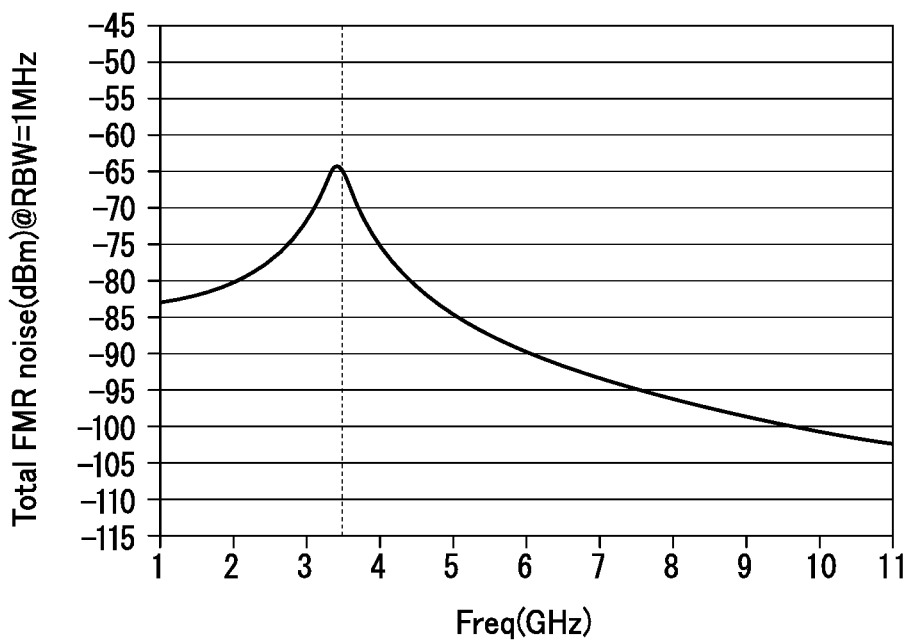
FIG. 18 shows a result of a noise output electric power of the magnetoresistance effect device according to Comparative example 1.

In Comparative example 1, output characteristics of the magnetoresistance effect device in which an independent magnetic body is not provided were obtained. FIG. 16 is an enlarged schematic view of a major part of the magnetoresistance effect device of Comparative example 1. The output voltage and the noise output electric power were calculated through simulation under the same condition as in Example 1 except that the independent magnetic body is removed and the bias magnetic field $H_{ext}$ is 100 Oe. The result is shown in FIG. 17 and FIG. 18. FIG. 17 shows a result of an output voltage of the magnetoresistance effect device according to Comparative example 1, and FIG. 18 shows a result of a noise output electric power of the magnetoresistance effect device according to Comparative example 1.

In Comparative example 1, as the bias magnetic field $H_{ext}$ is changed, a ferromagnetic resonance frequency of the magnetization free layer was varied to 3.1 GHz. In addition, since a distance between the first signal line and the magnetization free layer is decreased because the independent magnetic body is not present, the magnetization free layer receives a larger high frequency magnetic field from the first signal line.

Comparing the result (FIG. 14) of the output voltage around 3 GHz of the magnetoresistance effect device of Example 1 and the result (FIG. 17) of the output voltage around 3 GHz of the magnetoresistance effect device of Comparative example 1, while the output voltage of Example 1 was 7.0 mV, the output voltage of Comparative example 1 was 1.4 mV. That is, when a driving region of the magnetoresistance effect device is 3 GHz, Example 1 shows output characteristics five times Comparative example 1. In addition, comparing the results of the noise output voltage around 3 GHz, the noise output electric power (FIG. 15) of Example 1 was 1/100 of the noise output electric power (FIG. 18) of Comparative example 1.

Comparative Example 2

Figure 19:
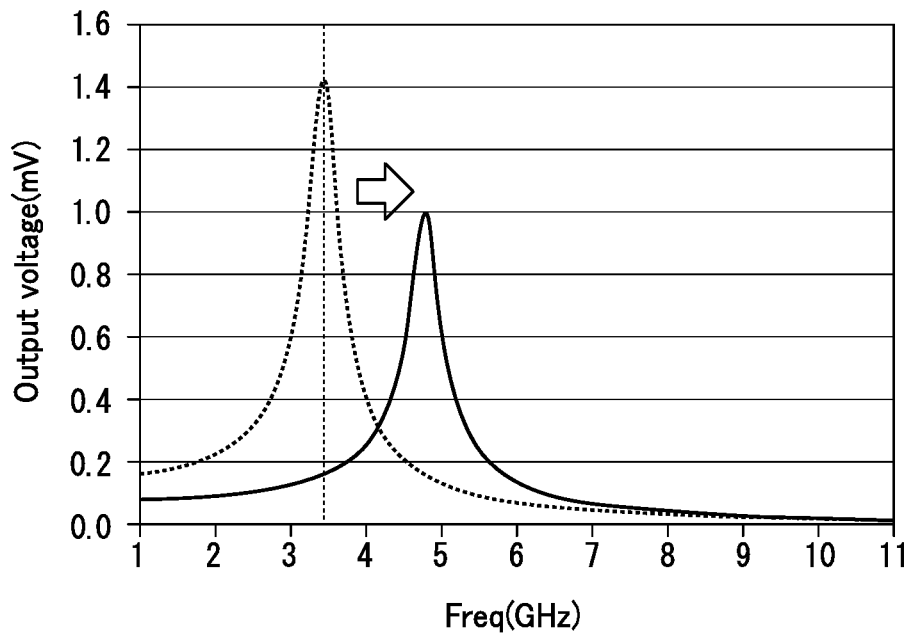
FIG. 19 shows a result of an output voltage of a magnetoresistance effect device according to Comparative example 2.

Comparative example 2 was under the same condition as Comparative example 1 except that the bias magnetic field $H_{ext}$ was 192 Oe. FIG. 19 shows a result of an output voltage of the magnetoresistance effect device according to Comparative example 2, and FIG. 20 shows a result of a noise output electric power of the magnetoresistance effect device according to Comparative example 2.

Figure 20:
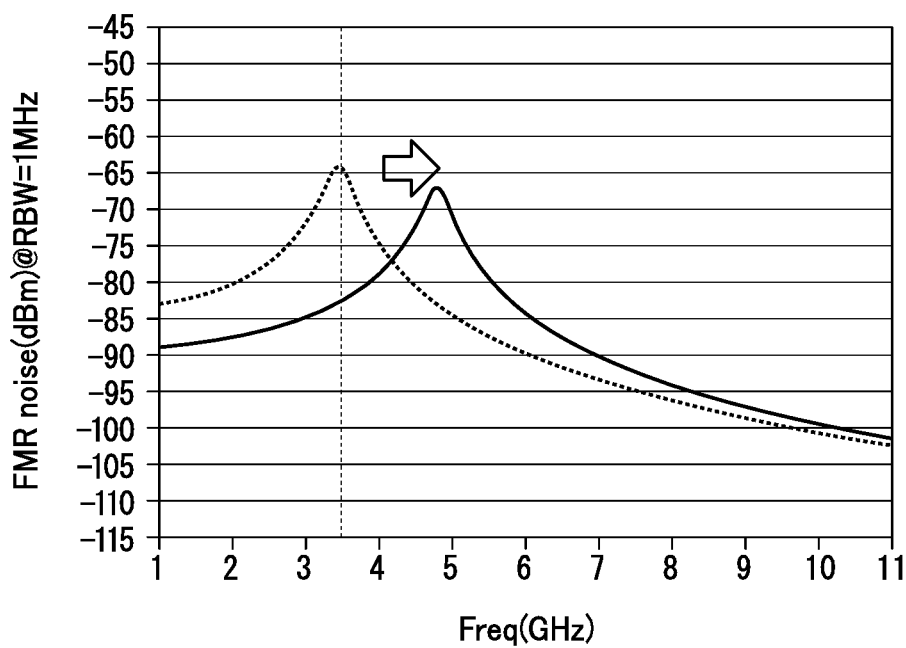
FIG. 20 shows a result of a noise output electric power of the magnetoresistance effect device according to Comparative example 2.

As shown in FIG. 19 and FIG. 20, both of a position of a peak of the output voltage and a position of a peak of the noise output electric power were shifted from the position of the peak in Comparative example 1 (shown by a dot line). That is, as the magnitude of the bias magnetic field $H_{ext}$ from the external magnetic field application mechanism is varied, the ferromagnetic resonance frequency of the magnetization free layer can be varied. In addition, the ferromagnetic resonance frequency of the magnetization free layer of Comparative example 2 was almost equal to the ferromagnetic resonance frequency of the magnetization free layer in Example 1 because the magnitude of the applied bias magnetic field $H_{ext}$ is equal.

Example 2

Figure 21:
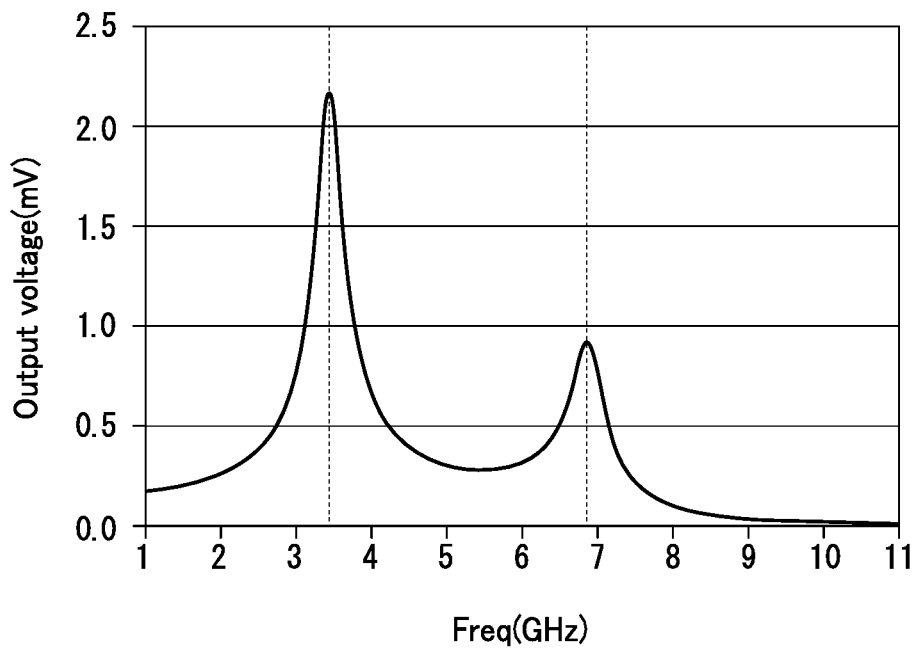
FIG. 21 shows a result of an output voltage of a magnetoresistance effect device according to Example 2.
Figure 22:
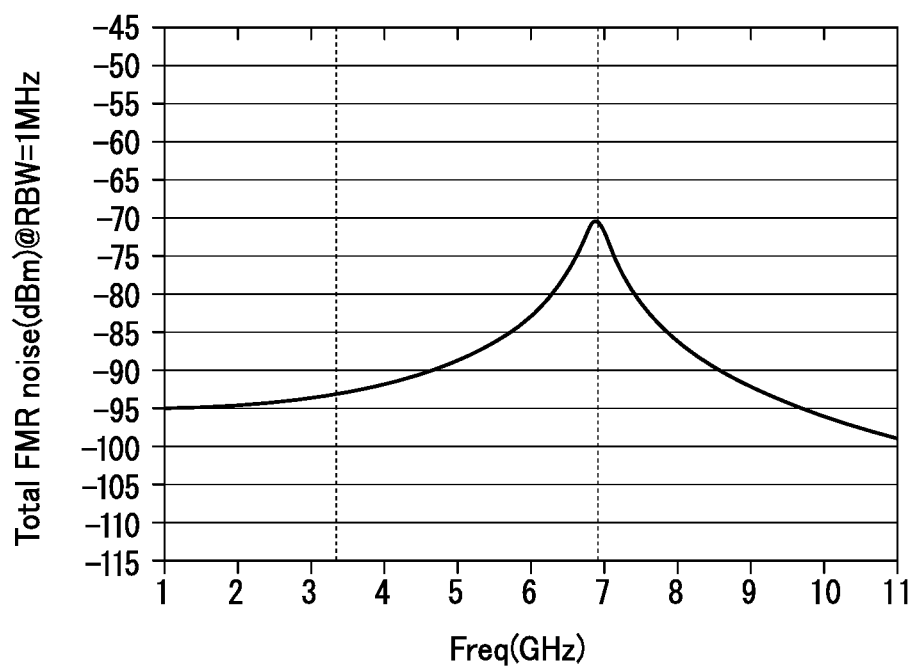
FIG. 22 shows a result of a noise output electric power of the magnetoresistance effect device according to Example 2.
Figure 23:
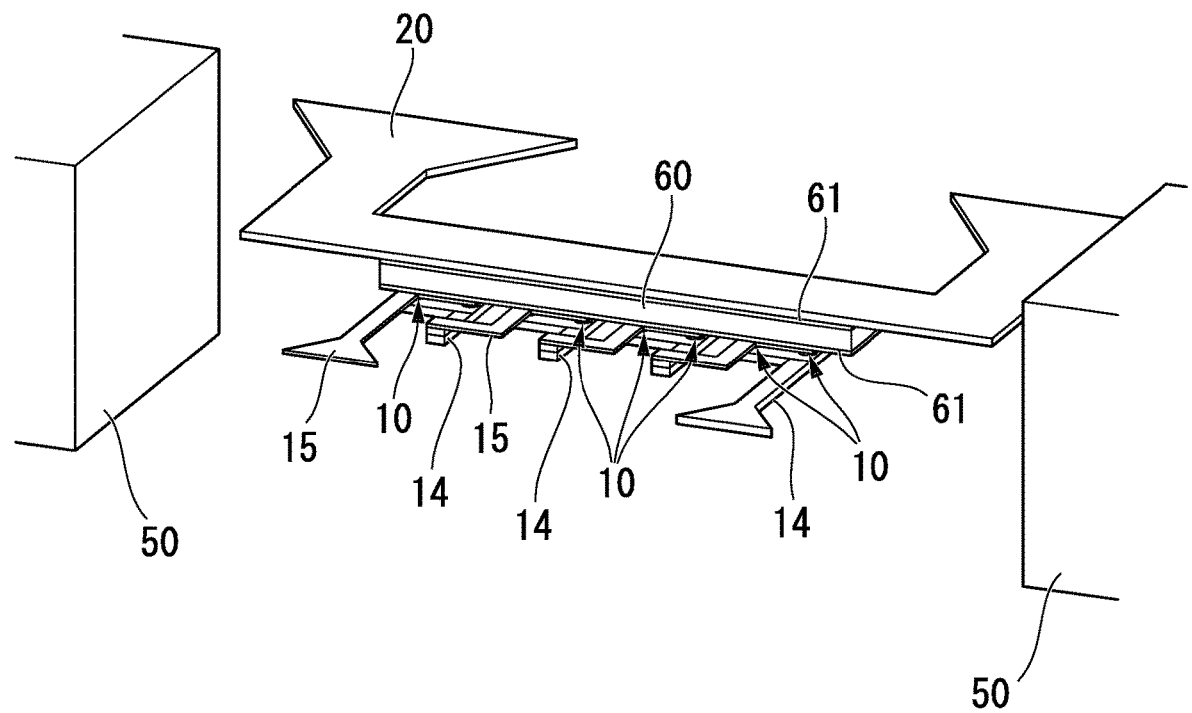
FIG. 23 is an enlarged schematic view of a major part of a magnetoresistance effect device of Example 3.

Example 2 is distinguished from Example 1 in that the magnitude of the bias magnetic field $H_{ext}$ applied to the magnetization free layer was 392 Oe. Further, the magnitude of the bias magnetic field $H_{ext}$ applied to the independent magnetic body 60 was 192 Oe. Then, the output voltage and the noise output electric power output from the magnetoresistance effect device of Example 2 were calculated through simulation. The results are shown in FIG. 21 and FIG. 22. FIG. 21 shows a result of an output voltage of the magnetoresistance effect device according to Example 2, and FIG. 23 shows a result of a noise output electric power of the magnetoresistance effect device according to Example 2.

As shown in FIG. 21, in the output voltage of the magnetoresistance effect device according to Example 2, two peaks were seen at 3.4 GHz and 6.7 GHz. The peak at 3.4 GHz is provided according to the ferromagnetic resonance of the independent magnetic body 60, and the peak at 6.7 GHz is provided according to the ferromagnetic resonance of the magnetization free layer. Since the magnitude of the bias magnetic field $H_{ext}$ applied to the independent magnetic body 60 is the same as in Example 1, the ferromagnetic resonance frequency of the independent magnetic body 60 was not varied. On the other hand, since the magnitude of the bias magnetic field $H_{ext}$ applied to the magnetization free layer is increased, the ferromagnetic resonance frequency of the magnetization free layer was shifted.

In addition, a peak position of the noise output electric power shown in FIG. 22 was shifted. This is because a thermal fluctuation of the magnetization is increased around the resonance frequency of the magnetization free layer. As the peak position of the noise output voltage is shifted, a value of the noise output voltage around 3 GHz can be decreased to be smaller than that in Example 1 (FIG. 15).

Example 3

Figure 24:
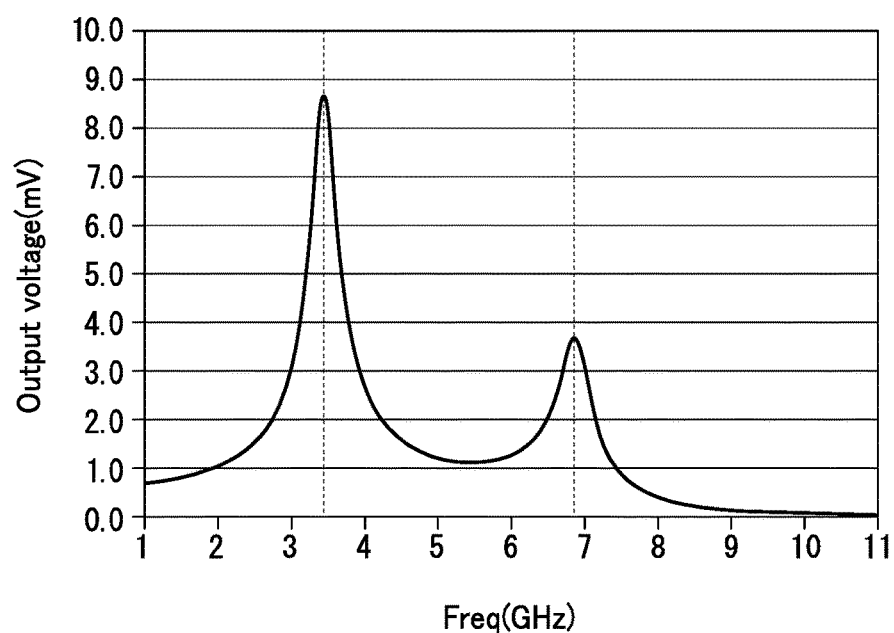
FIG. 24 shows a result of an output voltage of the magnetoresistance effect device according to Example 3.
Figure 25:
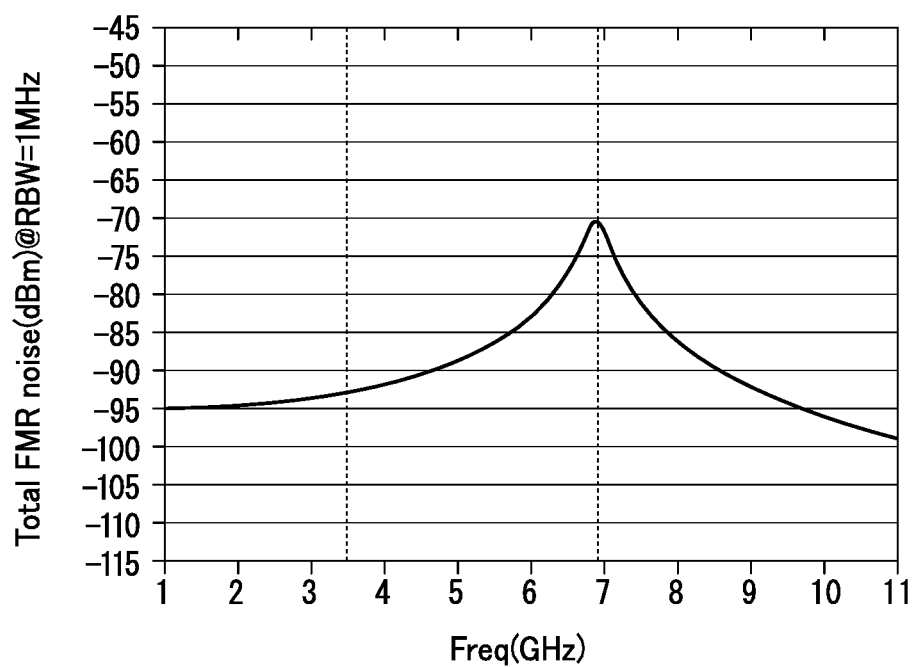
FIG. 25 shows a result of a noise output electric power of the magnetoresistance effect device according to Example 3.

Example 3 is distinguished from Example 2 in that a plurality of magnetoresistance effect elements 10 are provided. FIG. 23 is an enlarged schematic view of a major part of a magnetoresistance effect device according to Example 3. The magnetoresistance effect device according to Example 3 has four groups arranged in series, and each group has four magnetoresistance effect elements 10 arranged in parallel between the upper electrode 15 and the lower electrode 14. Then, the output voltage and the noise output electric power output from the magnetoresistance effect device of Example 3 were calculated through simulation. The results are shown in FIG. 24 and FIG. 25. FIG. 24 shows a result of an output voltage of the magnetoresistance effect device according to Example 3, and FIG. 25 shows a result of a noise output electric power of the magnetoresistance effect device according to Example 3.

As shown in FIG. 24, as the plurality of magnetoresistance effect elements 10 are installed, the output voltage in Example 3 was four times the output voltage (FIG. 21) in Example 2. On the other hand, as shown in FIG. 25, the magnitude of the noise output electric power in Example 3 was not different from the output voltage (FIG. 22) in Example 3.

While preferred embodiments of the invention have been described and illustrated above, it should be understood that these are exemplary of the invention and are not to be considered as limiting. Additions, omissions, substitutions, and other modifications can be made without departing from the spirit or scope of the present disclosure. Accordingly, the invention is not to be considered as being limited by the foregoing description, and is only limited by the scope of the appended claims.

EXPLANATION OF REFERENCES

1 First port
2 Second port
10 Magnetoresistance effect element
11 First ferromagnetic layer (magnetization fixed layer)
12 Second ferromagnetic layer (magnetization free layer)
13 Spacer layer
14 Lower electrode
15 Upper electrode
20 First signal line
30 Output signal line (second signal line)
31 Third signal line
40 Direct current application terminal
41 Power supply
42 Inductor
50 Magnetic field application mechanism
60 Independent magnetic body
61 Insulating layer
G Ground
100, 101, 102, 103, 104, 105, 106 Magnetoresistance effect device
$M_{11}$, $M_{12}$ Magnetization
RF High frequency magnetic field

What is claimed is:

1. A magnetoresistance effect device comprising:
a magnetoresistance effect element having a first ferromagnetic layer, a second ferromagnetic layer, and a spacer layer sandwiched between the first ferromagnetic layer and the second ferromagnetic layer;
a first port configured for a high frequency signal to be input;
a second port configured for a high frequency signal to be output;
a first signal line connected to the first port and configured to generate a high frequency magnetic field when a high frequency current corresponding to the high frequency signal input into the first port flows;
a second signal line;
a direct current application terminal to which a power supply is able to be connected to cause a direct current to flow to the magnetoresistance effect element in a lamination direction; and
an independent magnetic body configured to receive a high frequency magnetic field generated in the first signal line to oscillate magnetization and apply a magnetic field generated through the magnetization to the magnetoresistance effect element, wherein
the magnetoresistance effect element is connected to the second port via the second signal line, and
the direct current application terminal is connected to the magnetoresistance effect element.

2. The magnetoresistance effect device according to claim 1, wherein a resonance frequency of the independent magnetic body is smaller than a resonance frequency of the first ferromagnetic layer and the second ferromagnetic layer.

3. The magnetoresistance effect device according to claim 2, further comprising:
a low pass filter configured to reduce a part of a signal output to the outside, wherein the low pass filter allows a frequency smaller than the resonance frequency of the first ferromagnetic layer and the second ferromagnetic layer to pass therethrough.

4. The magnetoresistance effect device according to claim 1, wherein a volume of the independent magnetic body is 100 times or more a volume of the first ferromagnetic layer or the second ferromagnetic layer.

5. The magnetoresistance effect device according to claim 2, wherein a volume of the independent magnetic body is 100 times or more a volume of the first ferromagnetic layer or the second ferromagnetic layer.

6. The magnetoresistance effect device according to claim 1, wherein a damping constant of the independent magnetic body is 0.005 or less.

7. The magnetoresistance effect device according to claim 2, wherein a damping constant of the independent magnetic body is 0.005 or less.

8. The magnetoresistance effect device according to claim 1, wherein the independent magnetic body is an insulating material.

9. The magnetoresistance effect device according to claim 1, wherein the independent magnetic body is an electrical conductor.

10. The magnetoresistance effect device according to claim 1, further comprising:
a magnetic field application mechanism configured to apply an external magnetic field to the independent magnetic body, and modulate a resonance frequency of at least one of the independent magnetic body, the first ferromagnetic layer and the second ferromagnetic layer.

11. The magnetoresistance effect device according to claim 1, further comprising:
a bias magnetic layer configured to apply an external magnetic field to the first ferromagnetic layer or the second ferromagnetic layer of the magnetoresistance effect element, and modulate a resonance frequency of the first ferromagnetic layer or the second ferromagnetic layer.

12. The magnetoresistance effect device according to claim 1, wherein a plurality of magnetoresistance effect elements are provided, and the plurality of magnetoresistance effect elements are disposed with respect to the one independent magnetic body.

13. The magnetoresistance effect device according to claim 1, wherein a plurality of magnetoresistance effect elements and a plurality of independent magnetic bodies are provided, and each independent magnetic body is disposed with respect to one magnetoresistance effect element, respectively.

14. The magnetoresistance effect device according to claim 12, wherein at least some of the plurality of magnetoresistance effect elements are arranged parallel to each other.

15. The magnetoresistance effect device according to claim 12, wherein at least some of the plurality of magnetoresistance effect elements are arranged in series.

16. The magnetoresistance effect device according to claim 12, wherein each of the plurality of magnetoresistance effect elements has an output signal line through which a high frequency current output from the magnetoresistance effect element flows, and at least one of the output signal lines is disposed at a position where a high frequency magnetic field is applied to the independent magnetic body configured to apply a magnetic field to at least one of the plurality of magnetoresistance effect elements.

17. The magnetoresistance effect device according to claim 13, wherein at least some of the plurality of magnetoresistance effect elements are arranged parallel to each other.

18. The magnetoresistance effect device according to claim 13, wherein at least some of the plurality of magnetoresistance effect elements are arranged in series.

19. The magnetoresistance effect device according to claim 13, wherein each of the plurality of magnetoresistance effect elements has an output signal line through which a high frequency current output from the magnetoresistance effect element flows, and at least one of the output signal lines is disposed at a position where a high frequency magnetic field is applied to the independent magnetic body configured to apply a magnetic field to at least one of the plurality of magnetoresistance effect elements.

20. A high frequency device using the magnetoresistance effect device according to claim 1.

* * * * *